US008630435B2

(12) United States Patent
Mellow et al.

(10) Patent No.: US 8,630,435 B2
(45) Date of Patent: Jan. 14, 2014

(54) APPARATUS INCORPORATING AN ADSORBENT MATERIAL, AND METHODS OF MAKING SAME

(75) Inventors: Tim John Mellow, Farnham (GB); Asta Maria Karkkainen, Helsinki (FI); Andrew John Flewitt, Cambridge (GB)

(73) Assignee: Nokia Corporation, Espoo (FI)

( * ) Notice: Subject to any disclaimer, the term of this patent is extended or adjusted under 35 U.S.C. 154(b) by 918 days.

(21) Appl. No.: 12/383,850

(22) Filed: Mar. 26, 2009

(65) Prior Publication Data

US 2010/0034411 A1 Feb. 11, 2010

Related U.S. Application Data

(60) Provisional application No. 61/188,402, filed on Aug. 8, 2008.

(51) Int. Cl.

| | |
|---|---|
| ***H04R 1/28*** | (2006.01) |
| ***H05K 5/02*** | (2006.01) |
| *H04R 1/20* | (2006.01) |

(52) U.S. Cl.
USPC ........... 381/345; 381/353; 381/354; 181/146; 181/151

(58) Field of Classification Search
USPC ......... 381/345, 346, 348, 352, 353, 354, 160, 381/433; 181/146, 151, 155, 166, 199, 292, 181/293, 295
See application file for complete search history.

(56) References Cited

U.S. PATENT DOCUMENTS 1,572,387 A * 2/1926 Harrison ...................... 181/198
1,975,201 A * 10/1934 Elworthy ..................... 181/155
2,295,483 A * 9/1942 Knowles ...................... 381/404
2,549,963 A * 4/1951 De Boer et al. ............... 381/349
2,766,839 A * 10/1956 Baruch et al. ................ 181/146
2,797,766 A 7/1957 Sullivan ..................... 181/31
2,840,179 A * 6/1958 Junger ....................... 181/286
3,247,926 A * 4/1966 Metros ....................... 181/151
3,381,773 A * 5/1968 Schenkel ..................... 181/158
3,496,307 A * 2/1970 Sotome ....................... 381/420
3,617,654 A * 11/1971 Heidrich ..................... 381/346
3,662,124 A * 5/1972 Hassler et al. ............... 381/357
3,680,658 A * 8/1972 Goeskel ...................... 181/151

(Continued)

FOREIGN PATENT DOCUMENTS

EP 0 040 063 A1 11/1981
EP 1 732 350 A1 12/2006

(Continued)

OTHER PUBLICATIONS

"The Virtual Loudspeaker Cabinet", J. R. Wirght, KEF Audio (UK) LTD., KEF White Paper, Feb. 2001, 7 pgs.

*Primary Examiner* — Edgardo San Martin

(74) *Attorney, Agent, or Firm* — Harrington & Smith

(57) ABSTRACT

Apparatus for compensating for pressure changes in an acoustic transducer system includes a skeleton member having a predetermined configuration and adsorbent material having a regular structure and being supported on the skeleton member. The apparatus may include a plurality of members, each of the plurality of members having a plurality of hollows formed therein, at least one main surface of each of the plurality of members substantially facing and spaced apart from a main surface of an adjacent one of the plurality of members, and the adsorbent material may be provided within each of the plurality of hollows.

42 Claims, 22 Drawing Sheets

(56) References Cited

U.S. PATENT DOCUMENTS

| | | | | |
|---|---|---|---|---|
| 3,884,326 | A * | 5/1975 | Orisek | 181/155 |
| 3,953,675 | A * | 4/1976 | Babb | 381/353 |
| 4,044,855 | A * | 8/1977 | Kobayashi | 181/151 |
| 4,189,627 | A * | 2/1980 | Flanagan | 381/353 |
| 4,356,882 | A * | 11/1982 | Allen | 181/151 |
| 4,440,983 | A * | 4/1984 | Facoetti et al. | 381/190 |
| 4,619,342 | A * | 10/1986 | Buck | 181/184 |
| 4,657,108 | A | 4/1987 | Ward | 181/151 |
| 4,690,244 | A * | 9/1987 | Dickie | 181/146 |
| 4,793,980 | A | 12/1988 | Torobin | 423/213.5 |
| 4,817,757 | A * | 4/1989 | Perret et al. | 181/288 |
| 4,869,340 | A * | 9/1989 | Coudoux | 181/146 |
| 4,898,260 | A * | 2/1990 | Fang | 181/148 |
| 5,170,436 | A * | 12/1992 | Powell | 381/338 |
| 5,333,204 | A * | 7/1994 | Hamada et al. | 381/346 |
| 5,393,940 | A * | 2/1995 | Bedard et al. | 181/210 |
| 5,583,324 | A * | 12/1996 | Thomasen | 181/199 |
| 6,549,637 | B1 * | 4/2003 | Risch | 381/397 |
| 7,086,498 | B2 * | 8/2006 | Choi et al. | 181/270 |
| 7,269,270 | B2 * | 9/2007 | Freeman et al. | 381/346 |
| 7,463,747 | B2 * | 12/2008 | Kuze et al. | 381/345 |
| 7,477,755 | B2 * | 1/2009 | Saiki et al. | 381/349 |
| 7,743,877 | B2 * | 6/2010 | Saiki et al. | 181/151 |
| 7,743,880 | B2 * | 6/2010 | Matsumura et al. | 181/198 |
| 7,801,320 | B2 * | 9/2010 | Mellow | 381/338 |
| 7,840,022 | B2 * | 11/2010 | Matsumura et al. | 381/345 |
| 7,953,240 | B2 * | 5/2011 | Matsumura et al. | 381/354 |
| 7,974,423 | B2 * | 7/2011 | Matsumura et al. | 381/166 |
| 7,991,181 | B2 * | 8/2011 | Saiki et al. | 381/386 |
| 8,184,826 | B2 * | 5/2012 | Matsumura et al. | 381/89 |
| 2002/0085968 | A1 | 7/2002 | Smalley et al. | 42/198 |
| 2004/0251077 | A1 | 12/2004 | Wright et al. | 181/151 |
| 2006/0269095 | A1 | 11/2006 | Matsumura et al. | 381/421 |
| 2007/0165895 | A1 * | 7/2007 | Matsumura et al. | 381/351 |
| 2007/0195982 | A1 | 8/2007 | Saiki et al. | 381/345 |
| 2007/0286449 | A1 | 12/2007 | Matsumura et al. | 381/433 |
| 2008/0170737 | A1 * | 7/2008 | Saiki et al. | 381/346 |
| 2009/0028370 | A1 | 1/2009 | Matsumura et al. | 381/386 |
| 2009/0245562 | A1 * | 10/2009 | Saiki et al. | 381/345 |
| 2010/0206658 | A1 * | 8/2010 | Slotte | 181/151 |
| 2010/0329498 | A1 * | 12/2010 | Rouvala et al. | 381/354 |
| 2011/0026751 | A1 * | 2/2011 | Hilbowicki | 381/345 |

FOREIGN PATENT DOCUMENTS

| | | | |
|---|---|---|---|
| EP | 1 737 266 | A1 | 12/2006 |
| EP | 1 868 409 | A1 | 12/2007 |
| EP | 1 868 410 | A1 | 12/2007 |
| EP | 2003924 | A1 | 12/2008 |
| EP | 2073569 | A1 | 6/2009 |
| JP | 2006101031 | A | 4/2006 |
| JP | 2007288712 | A | 11/2007 |
| WO | WO-8403600 | A1 | 9/1984 |
| WO | WO-03/101147 | A1 | 12/2003 |
| WO | WO-2007/102056 | A1 | 9/2007 |
| WO | WO-2007116859 | A1 | 10/2007 |

* cited by examiner

APPARATUS INCORPORATING AN ADSORBENT MATERIAL, AND METHODS OF MAKING SAME

CROSS REFERENCE TO RELATED APPLICATION

This patent application claims priority under 35 U.S.C. §119(e) from U.S. Provisional Patent Application No. 61/188,402, filed on Aug. 8, 2008 which is incorporated by reference herein in its entirety.

FIELD

This invention relates to an apparatus arranged for compensating for pressure changes in an acoustic transducer system and a method of making the same.

BACKGROUND

The problem of back-to-front cancellation in acoustic devices, such as loudspeakers, has long been known. Such cancellation is due to sound waves produced by the back of the loudspeaker diaphragm destructively interfering with sound waves produced by the front of the loudspeaker diaphragm. The problem is particularly prominent at low (bass) frequencies. One way of reducing the effects of this problem is to house the loudspeaker in an enclosure, thereby containing the interfering sound waves produced by the back of the loudspeaker diaphragm. However, this solution presents problems. One such problem is that gas within the enclosure impedes the movement of the loudspeaker diaphragm. Not only does this reduce the efficiency of the loudspeaker, but also it can negatively affect the bass performance of the loudspeaker. The resonant frequency of a loudspeaker unit is dependent on the mass of the driver, and the combination of the impedance to diaphragm movement both due to the air in the enclosure and due to the suspension of the loudspeaker. The impedance of the combination is higher than either impedance individually. Consequently, the resonant frequency of the loudspeaker unit is increased (and the bass performance is decreased) when a loudspeaker is enclosed. One way to reduce the impedance of the air in the enclosure (and thus improve the bass performance of the loudspeaker) is to enlarge the enclosure, for example by introducing a cavity behind the loudspeaker cone. However, this necessarily results in an enlarged loudspeaker unit. This is particularly undesirable when manufacturing loudspeakers for mobile devices such as mobile phones, PDA's, laptops and the like.

SUMMARY

According to a first aspect, an apparatus is provided, the apparatus comprising a skeleton member having a predetermined configuration, and adsorbent material having a regular structure and being supported on the skeleton member, wherein the apparatus is arranged for compensating for pressure changes in an acoustic transducer system.

The skeleton member may have a plurality of hollows formed therein, the adsorbent material being supported within each of the plurality of hollows. The adsorbent material may comprise a plurality of carbon nanotubes. The plurality of nanotubes may be arranged normal to a surface of one of the plurality of hollows.

Each of the plurality of hollows may form a duct through the skeleton member.

The acoustic transducer system may comprise a loudspeaker.

The skeleton member may comprise a plurality of sub-members. Each sub-member of the plurality of sub-members may be spaced apart from adjacent ones of the plurality of sub-members. Each sub-member of the plurality of sub-members is substantially identical to the other sub-members of the plurality of sub-members.

A maximum dimension through a centre point of an opening of each of the hollows may be less than the distance between adjacent sub-members.

The skeleton member may have a predetermined regular configuration.

Each of the plurality of sub-members may comprise a plate member.

An outermost boundary of the skeleton member may be substantially cylindrical in form.

Alternatively, the skeleton member may be substantially spheroidal. A maximum dimension through a centre point of an opening of each of the hollows may be in the range of 0.5%-5% of a maximum diameter of the skeleton member. The apparatus may comprise an agglomeration of skeleton members each having a predetermined configuration and supporting thereon adsorbent material having a regular structure. The plurality of skeleton members may be substantially identical to the other skeleton members of the plurality of skeleton members.

According to a second aspect a method is provided, the method comprising forming a skeleton member with a predetermined configuration, and supporting an adsorbent material having a regular structure on the skeleton member, wherein the method is a method of manufacturing an apparatus for compensating for pressure changes in an acoustic transducer system.

According to a third aspect, an apparatus is provided, the apparatus comprising a plurality of members, each of the plurality of members having a plurality of hollows formed therein, at least one main surface of each of the plurality of members substantially facing and spaced apart from a main surface of an adjacent one of the plurality of members, and an adsorbent material having a regular structure provided within each of the plurality of hollows.

Each member of the plurality of members may be substantially identical to the other members of the plurality of members.

The adsorbent material may comprise a plurality of carbon nanotubes. Each of the plurality of nanotubes may be arranged normal to a surface of one of the plurality of hollows.

The pluralities of hollows formed in each of the plurality of members may be regularly arranged.

A maximum dimension through a centre point of an opening of each of the hollows may be less than the distance between adjacent members.

Each of the plurality of members may comprise a plate member.

Each of the plurality of hollows may comprise a duct through one of the plurality of members. The members may be spaced apart at regular intervals.

According to a fourth aspect, a method is provided, the method comprising forming a plurality of members each with a plurality of hollows therein, arranging the plurality of members such that at least one main surface of each of the plurality of members substantially faces and is spaced apart from one main surface of an adjacent one of the plurality of members providing an adsorbent material having a regular structure within each of the plurality of hollows.

According to a fifth aspect an apparatus is provided, comprising a plurality of substantially spheroidal members arranged in an agglomeration, each of the plurality of members having a plurality of hollows formed therein and an adsorbent material having a regular structure provided within each of the plurality of hollows.

Each member of the plurality of members may be substantially identical to the other members of the plurality of members.

The maximum dimension through a centre point of an opening of each of the hollows may be in the range of 0.5%-5% of a maximum diameter of a one of the substantially spheroidal members.

According to a sixth aspect, an acoustic transducer system is provided, the acoustic transducer system comprising apparatus arranged for compensating for pressure changes in the acoustic transducer system, the apparatus comprising a skeleton member having a predetermined configuration and adsorbent material having a regular structure and being supported on the skeleton member.

The acoustic transducer system as may comprise a diaphragm and a magnet and a cavity may be formed between the diaphragm and the magnet, and the apparatus may be contained within the cavity.

Alternatively, the cavity may be formed on the opposite side of the magnet to the diaphragm, and the apparatus may be contained within the cavity.

The acoustic transducer system may comprise an electrostatic speaker and the cavity may be formed adjacent the diaphragm, and the apparatus may be contained within the cavity.

The skeleton member may comprise a plurality of sub-members, and each of the plurality of sub-members may be arranged substantially perpendicularly to the diaphragm.

The acoustic transducer system may form part of a mobile device.

DETAILED DESCRIPTION OF THE EMBODIMENTS

Figure 1:
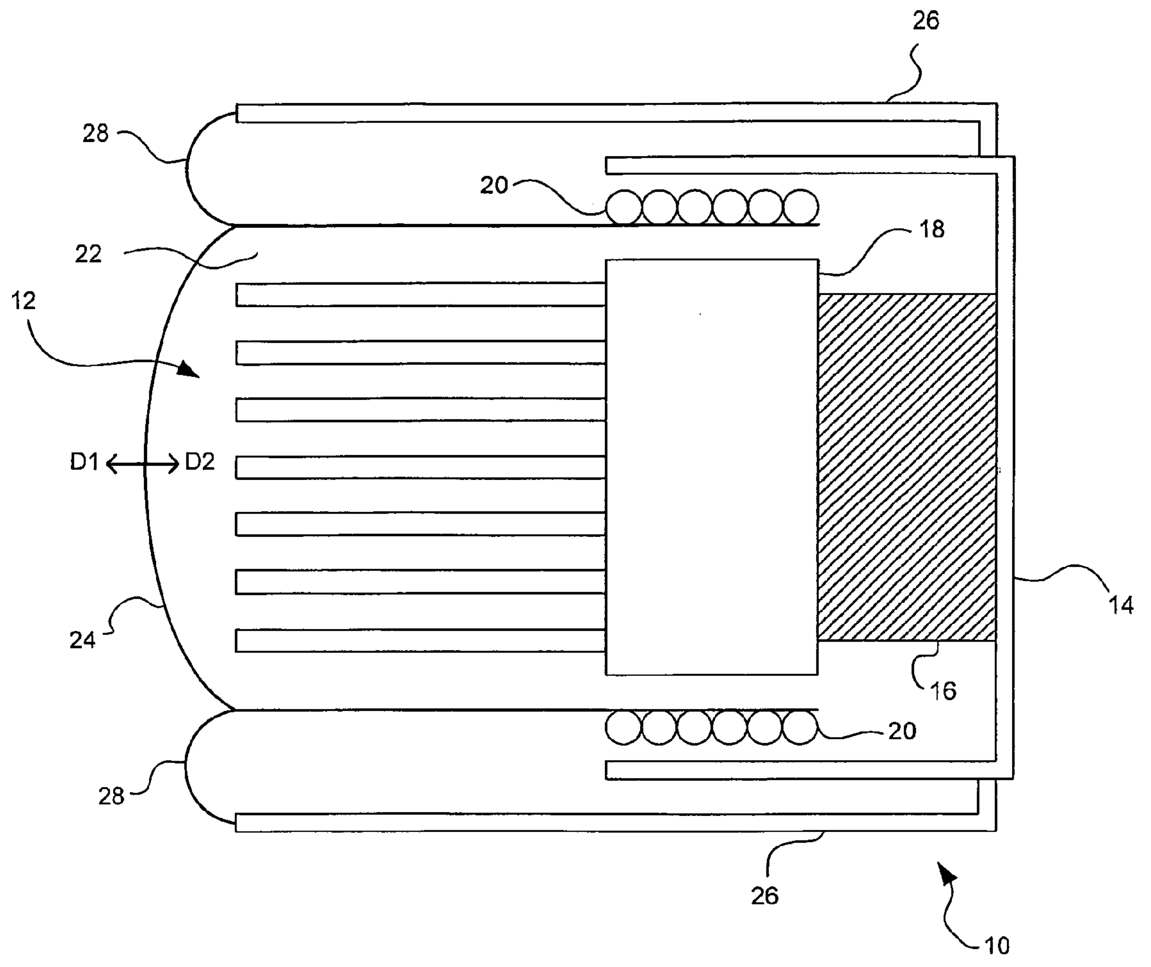
FIG. 1 is a schematic cross-sectional view of an electrodynamic loudspeaker unit including apparatus arranged for compensating for pressure changes in an acoustic transducer system.

FIG. 1 shows a cross-sectional view of an electrodynamic loudspeaker unit 10 including apparatus 12 suitable for compensating for pressure changes an acoustic device, such as the loudspeaker unit 10. The loudspeaker unit 10 operates to produce sound. The loudspeaker unit 10 comprises a main housing 14, a magnet 16, a pole-piece 18, a coil 20, a cavity 22, and a diaphragm 24. The loudspeaker unit further comprises a support housing 26 surrounding the main housing 14 and a support diaphragm 28 surrounding the diaphragm 24. The cavity 22 is formed between the pole-piece 18 and the diaphragm 24. The apparatus 12 is located within the cavity 22. The position of the apparatus 12 is fixed in relation to the pole-piece 18. This may be performed using any suitable technique, for example by gluing, laser gluing, or mechanical fixing.

The pole-piece 18 is in physical connection with the magnet 16 and is thus magnetized. The coil 20 surrounds the pole-piece 18. The diaphragm 24 is fixed to the coil 20. Consequently, when a varying current is passed through the coil 20, the resulting Lorrentz Force on the electrons in the coil 20 causes the coil 20, and thus the diaphragm 24 affixed to the coil 20, to oscillate. This oscillation results in sound being produced by the diaphragm 24.

It will be appreciated that the electrodynamic loudspeaker unit 10 may have a different configuration to that shown in FIG. 1 as long as the apparatus 12 is located suitably within the loudspeaker unit 10. A suitable location is one in which the pressure compensation apparatus 12 is able to compensate sufficiently for pressure changes within the loudspeaker unit 10.

Follows a discussion of what would happen to air within the loudspeaker unit 10 during oscillation of the diaphragm 24, if the pressure compensation apparatus 12 was not included in the loudspeaker unit 10. If the diaphragm 24 were caused to move in a first direction away from the pole-piece 18, denoted by the arrow D1, the volume of the cavity, and the thus volume of the gas inside the loudspeaker unit 10, would increase. This increase in volume would result in a reduced pressure within the loudspeaker unit 10. Thus, the air outside the loudspeaker unit 10, which would be at a higher pressure than the gas within the loudspeaker unit 10, would exert a force on the diaphragm 24 in a direction opposite the direction of movement of the diaphragm 24.

The converse is true if the diaphragm 24 were to move in a direction towards the pole-piece 18, denoted by the arrow D2. This movement would result in an increased air pressure within the loudspeaker unit 10. Thus, the air within the loudspeaker unit 10 would exert a force on the diaphragm 24 in a direction opposite to the direction of movement D2.

Consequently, in a standard loudspeaker unit not including the pressure compensating apparatus, a force always opposes the movement of the diaphragm. This negatively impacts the efficiency of conventional loudspeaker units. The efficiency of standard electrodynamic loudspeakers typically is less than 0.04%.

The pressure compensation apparatus 12 comprises a skeleton member having a predetermined configuration. The predetermined configuration preferably is regular. The apparatus further comprises an adsorbent material having a regular structure supported on the skeleton member. A number of alternative configurations for the structure of the apparatus 12 are described in greater detail below.

Adsorbency is a property of a material that causes molecules, either solid or liquid, to accumulate on the surface of the material. This accumulation (or adsorption) results from Van der Waals interactions between the surface of an adsorbent material and molecules surrounding the adsorbent material. The number of molecules adsorbed depends on both the concentration of molecules surrounding the adsorbent material and the surface area of the adsorbent material. An increase in the concentration of molecules surrounding the adsorbent material results in an increase in the number of molecules adsorbed. Similarly, a larger surface area results in larger number of molecules being adsorbed.

The pressure compensation apparatus 12 is arranged to compensate for the pressure changes within the loudspeaker unit 10. An increase in pressure within the loudspeaker unit 10 equates to an increase in the concentration of gas molecules within the loudspeaker unit 12. Thus, when the diaphragm 24 moves in the direction D2, and the gas pressure increases, an increased number of gas molecules are adsorbed by the apparatus 12. Consequently, fewer gas molecules are present in gaseous form within the loudspeaker unit 10, and thus the pressure within the loudspeaker unit 10 is reduced. In this way, the impedance to the movement of the diaphragm 24 by virtue of the greater pressure in the cavity is reduced.

Conversely, when the diaphragm 24 moves in the direction D1 and the gas pressure within the loudspeaker unit 10 decreases, some of the gas molecules previously adsorbed by the apparatus 12 are released from the surface of the apparatus 12 into the surrounding volume. Consequently, more gas molecules become present in the gas within the loudspeaker unit 10 and thus the pressure within the loudspeaker unit 10 is increased. In this way, the impedance to the movement of the diaphragm 24 by virtue of the reduced pressure in the cavity is reduced.

As a result of the reduction in the impedance to the movement of the diaphragm 24, less power may be required to drive the diaphragm 24 and thus the efficiency of the loudspeaker unit may be increased.

Previously, to reduce effective impedance of the diaphragm by air in an enclosed loudspeaker unit, large cavities were required. However, the inclusion of the pressure compensation apparatus 12 into loudspeaker units obviates the need for large cavities, and thus enables the production of smaller loudspeaker units. This is generally desirable in all types of loudspeaker design, and is particularly desirable in loudspeakers designed for mobile devices, such as mobile phones, PDAs, laptop computers and the like.

In the case of mobile devices, such as mobile phones, loudspeaker cavities are currently in the range of 1 to 2 centiliters (1 to 2 cubic centimeters). This is typically too small to achieve reasonable bass performance. This also constitutes a relatively large proportion of the volume of the mobile phone. The inclusion of the pressure compensation apparatus 12 in a loudspeaker unit can allow improved bass performance while also significantly reducing the proportion of the mobile phone taken up by the loudspeaker unit. Because the size of loudspeaker units can be significantly reduced, a particular unit or model may be incorporated into any design of mobile device, without the need to design the mobile device to accommodate a large speaker cavity.

As described above, the pressure compensation apparatus 12 comprises a skeleton member having a predetermined (optionally regular) configuration, with an adsorbent material having a regular structure being supported on the skeleton member.

A material having a regular structure should be understood to mean a material having a regular surface, wherein if the dimensions of the material are known, the surface area of the material is also known. If the surface area is known, the adsorbency of the material can be accurately predicted.

As the configuration of the skeleton member, on which the adsorbent material supported, is predetermined, and the adsorbent material has a regular structure, the adsorbency of the pressure compensation apparatus 12 is predictable, i.e. it can be determined in advance. Consequently, the performance of the different configurations of skeleton member and different types of adsorbent material can be simulated. In this way, it is possible to optimize the performance of the pressure compensation apparatus 12, and thus also the loudspeaker unit 10. Also, because of the predetermined configuration of the skeleton member and the regular structure of the adsorbent material, the apparatus is easily and accurately reproducible, with each reproduction having the same properties.

Figure 2:
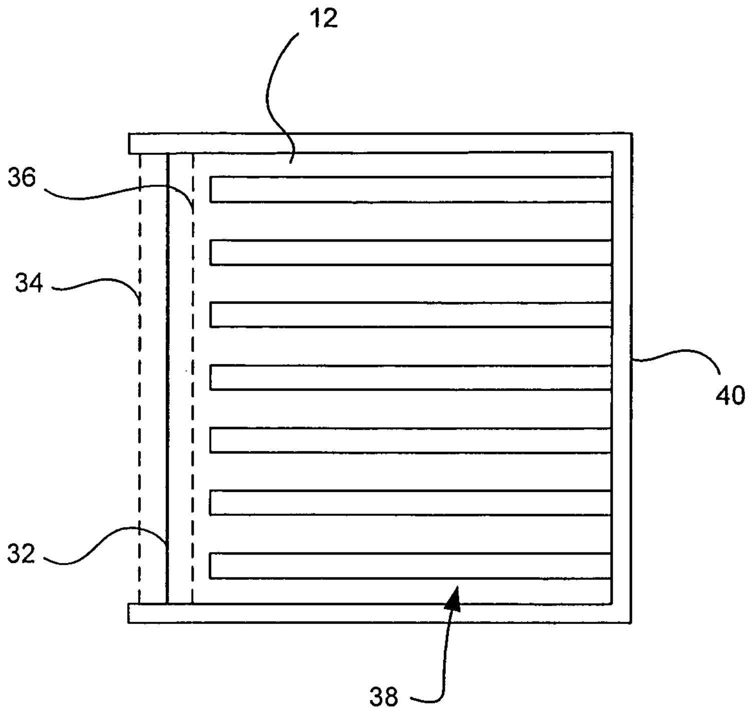
FIG. 2 is a schematic cross-sectional view of an alternative electrostatic loudspeaker unit including apparatus arranged for compensating for pressure changes in an acoustic transducer system.

The pressure compensation apparatus 12 may also provide significant advantages in other loudspeaker types. FIG. 2 shows a cross-sectional view of the pressure compensation apparatus 12 incorporated into a simplified schematic of an electrostatic loudspeaker unit 30.

The electrostatic loudspeaker unit depicted in FIG. 2 comprises a diaphragm 32 located between two electrodes 34 and 36. The electrodes 34 and 36 typically may be perforated metal plates. Alternatively, the rear one 36 of the two electrodes (the electrode to the right of the diaphragm 32 in FIG. 2) may be removed and the front end of the pressure compensation apparatus 12 (the end nearest the diaphragm 32) may act as the sole electrode. The mass of diaphragms in electrostatic loudspeakers is very low compared to those in electrodynamic speakers. Thus, electrostatic loudspeakers tend to have a particularly good high frequency response. Currently, however, electrostatic speakers cannot be produced with an enclosure/cavity to reduce back-to-front cancellation because the diaphragm has too low a mass to move the air within the enclosure. In theory, an enclosed electrostatic loudspeaker could be produced, but the cavity required would be so large that the loudspeaker unit would be impractical.

For the same reasons as described with reference to the electrodynamic loudspeaker unit 10 of FIG. 1, the apparatus 12 allows electrostatic loudspeakers to be enclosed while at the same time being relatively small. In FIG. 2, a cavity is formed between the loudspeaker housing 40 and the diaphragm 32. The apparatus 12 may be affixed to an inside rear surface of the loudspeaker housing 40 or in another suitable location within the cavity 38. A suitable location is one wherein the apparatus 12 can compensate for pressure changes in the cavity 38 and also does not interfere with the operation of the diaphragm 32.

Electrostatic loudspeakers have to date been impractical for use in mobile devices. However, the inclusion of the apparatus 12 into an electrostatic loudspeaker unit provides the possibility of using this type of speaker in a mobile device. Electrodynamic loudspeakers are very inefficient (typically they have an efficiency of less than 0.04%). This is largely because the electrical resistance of the coil results in a large amount of energy being dissipated as heat. Electrostatic loudspeakers, however, do not include such coils. Therefore, much higher efficiencies are achievable (the efficiency of a typical electrostatic loudspeaker is approximately 10%). High efficiency is especially important in mobile devices, in which conserving battery power is highly desirable.

The apparatus 12 may also be used in conjunction with electret speakers (which are similar to electrostatic speakers) and piezoelectric speakers.

Figure 3:
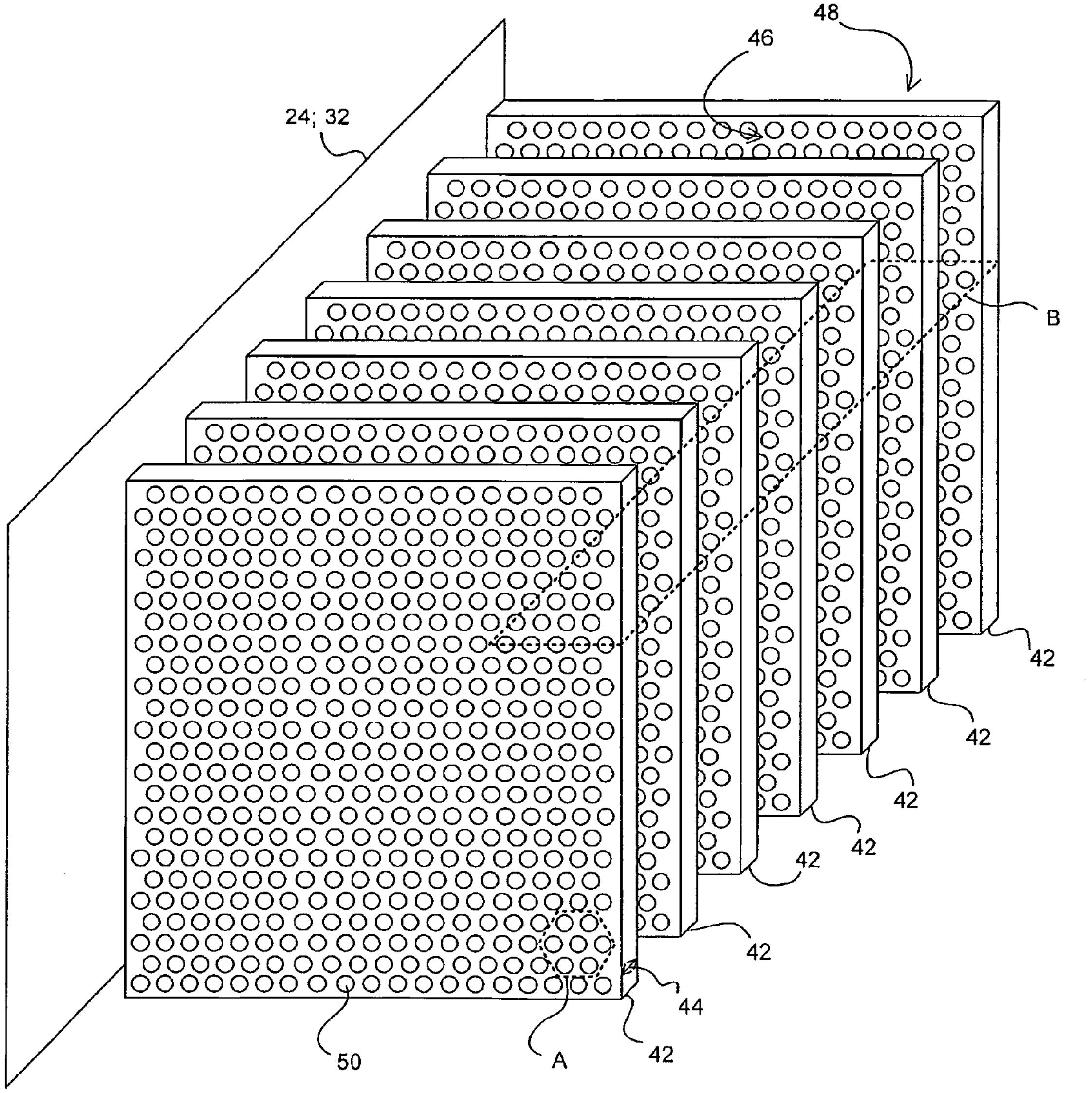
FIG. 3 shows the apparatus arranged for compensating for pressure changes in an acoustic transducer system of FIG. 1 or FIG. 2, in more detail.

FIG. 3 shows one embodiment of the pressure compensation apparatus 12 of FIGS. 1 and 2 in more detail. The pressure compensation apparatus 12 comprises a plurality of plates 42. In the embodiment of FIG. 3, there are seven plates. However, the apparatus 12 could contain any number of plates 42. The plates 42 have a substantially uniform thickness 44. The plates 42 have two main surfaces 46, 48 opposite and parallel to one another. The main surfaces 46, 48 each have a rectangular shape. It should be understood that the plates 42 alternatively may have non-uniform thicknesses. If the plates are of non-uniform thickness, it should be understood that the two main surfaces 46, 48 may not be exactly parallel but instead may be substantially parallel. Similarly, it should be understood that the main surfaces 46, 48 may have a different shape, for example square, circular or triangular. The plates 42 may be made of any suitable material. For instance, the material may be a rigid material having suitable damping qualities, such as to ameliorate or minimize internal vibration modes. The material may be molded plastic or silicon.

Figure 5:
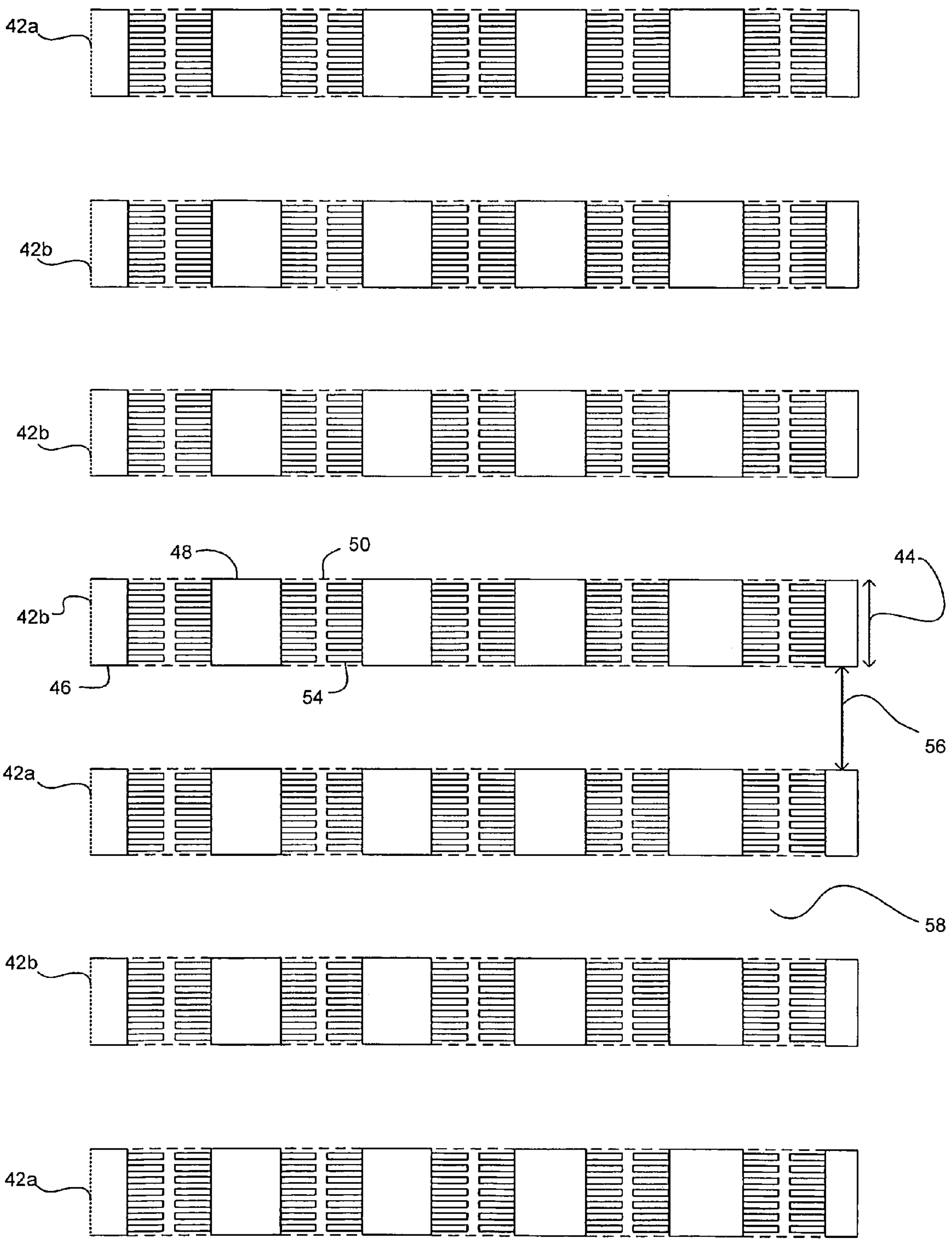
FIG. 5 is a cross-sectional view of the apparatus of FIG. 3.

The main surfaces 46, 48 of the plates 42 have a plurality of hollows 50 formed therein. In FIG. 3, it can be seen that the hollows 50 have a circular cross-sectional shape. However, it should be appreciated that other cross-sectional shapes also may be appropriate. The plurality of hollows 50 is arranged in a hexagonal array. That is, each hollow 50, except those located nearest to edges of the plates 42, are bordered by six other hollows 50 that are equidistant from the hollow. Although this arrangement allows the main surfaces 46, 48 to include the largest number of hollows 50 per unit area, it should be understood that other arrangements may also be suitable. As can be seen in FIG. 5, the hollows 50 are formed through entire thickness 44 of the plates 42, from one main surface 46 to the other 48, thus forming ducts or holes. It should be appreciated, however, that the hollows 50 alternatively may be formed through only part of the thickness 44 of the plates 42.

Figure 4:
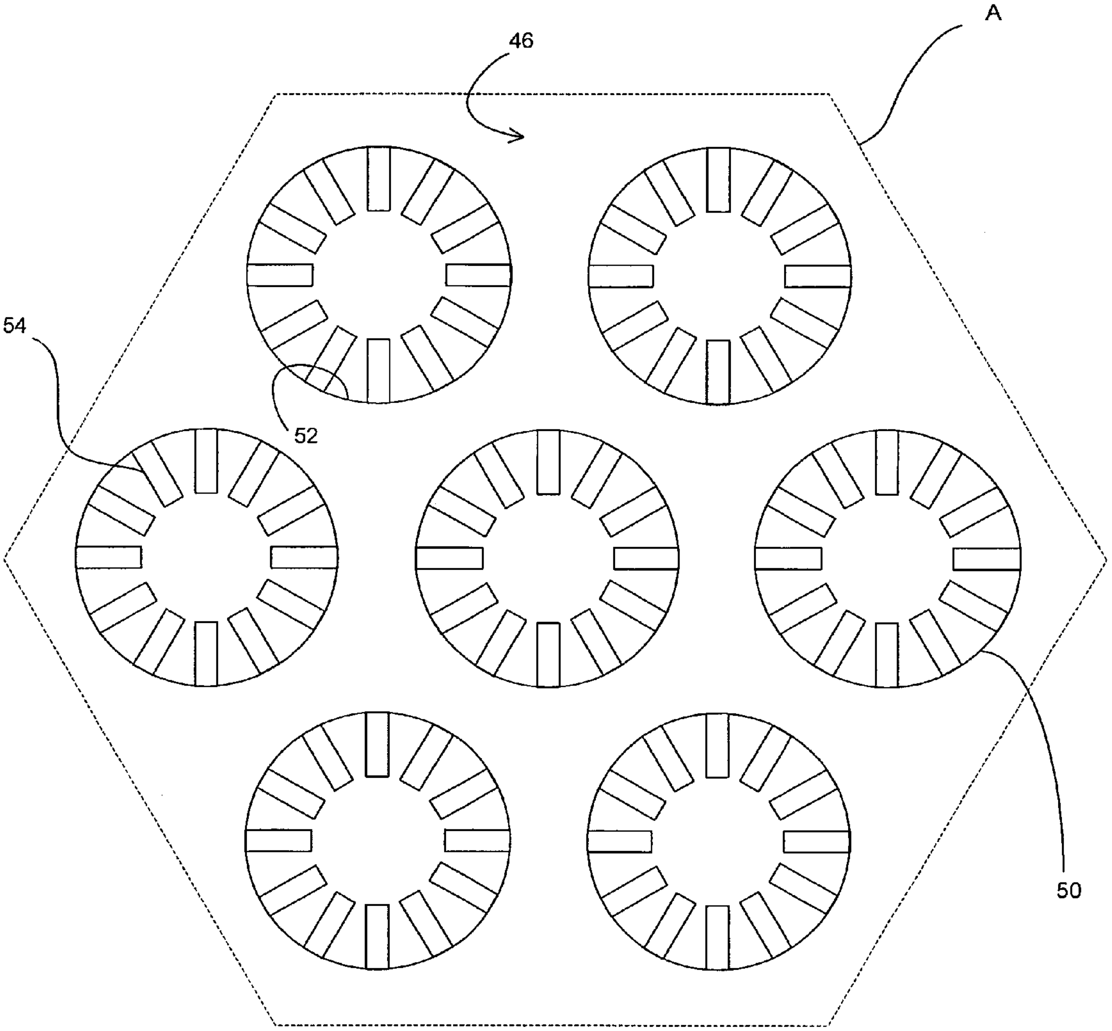
FIG. 4 is an enlarged view of a part of the apparatus of FIG. 3.

FIG. 4 shows an enlarged view of an area (denoted by the letter A in FIG. 3) of one of the main surfaces 46, 48 of one of the plates 42. The area A includes seven hollows 50 formed in one 46 of the main surfaces 46, 48 of the plates 42. The hollows 50 may have a diameter in the range of 100 nm to 10 μm. Fixed around the interior surface 52 of each of the hollows 50 are a plurality of nanotubes 54. The nanotubes may have a diameter of approximately 1 nm to 30 nm. The nanotubes 54 are oriented such that their lengths are normal to the interior surfaces 52 of the hollows 50. The word normal is used here to denote that the longitudinal axis of the nanotube is perpendicular to the surface at the location of the surface to which the nanotube is attached. Thus, the nanotubes 54 extend from the inner surfaces 52 of the plurality of hollows 50 towards central axes (perpendicular to the Figure) of the plurality of hollows 50. It will be appreciated that other orientations may also be appropriate. The nanotubes 54 may be grown in situ or alternatively may be fixed to the inner surfaces 52 of the hollows 50 after growth.

Nanotubes have adsorbent properties and have a regular structure. It should be understood that the nanotubes 54 may be omitted and instead a different suitable adsorbent material having a regular surface, for example graphite or a metal-organic framework may be used. The graphite or metal-organic framework may be provided in any suitable way. For instance, the graphite or metal-organic material may be provided as a layer on the surface of the hollows 50.

The main surfaces 46, 48 of the plates 42 may also be provided with a regular adsorbent material, for example graphite, metal-organic frameworks, or carbon nanotubes.

FIG. 5 shows a cross-sectional view through the plurality of plates 42, denoted by the letter B in FIG. 3. Each of the plurality of hollows 50 extends through the entire thickness of its respective plate 42 from one first main surface 46 to the other main surface 48 of the plate 42. Nanotubes 54 normal to the inner surfaces 52 of the hollows 50 are fixed at regular intervals along the entire length of the inner surfaces 52 of the plurality of hollows 54. The word normal is used here to denote that the longitudinal axis of the nanotube is perpendicular to the surface at the location of the surface to which the nanotube is attached It should be appreciated that alternatively it may be suitable for the nanotubes to be fixed normal to the inner surfaces 52 of the hollows 50 at irregular intervals.

Referring now to FIGS. 3 and 5, the plurality of plates 42 are arranged such that at least one of the two main surfaces 46, 48 of each of the plates 42 faces one of the two main surfaces 46, 48 of an adjacent one of the plurality of plates 42. In the case of plates **42*a* positioned at either end of the arrangement, only one of the main surfaces 46, 48 faces one of the main surfaces 46, 48 of an adjacent plate 42. In the case of the other plates 42*b* of the plurality, each of the two main surfaces 46, 48 faces a main surface of an adjacent plate 42**.

In the pressure compensation apparatus 12 of FIGS. 3 and 5, the plates 42 are arranged parallel to one another. However, it should be appreciated that an arrangement wherein the plates 42 are not parallel may also be suitable. The plates 42 are spaced apart from each other by a distance 56, thus forming channels 58 therebetween. The distance 24 may be, for example, between 10 μm and 100 μm. In the apparatus of FIGS. 5 and 5, the plates 42 are uniformly spaced apart from each other. However, it should be appreciated that it may be suitable for the plates 42 to be spaced at different distances.

As can be seen in FIGS. 1 to 3, when included in a loudspeaker unit, the plates 42 of the pressure compensation apparatus are arranged such that their main surfaces 46, 48 are substantially perpendicular to the loudspeaker diaphragm 24; 32 (this can be clearly seen in FIG. 3). This minimizes the flow resistance due to the pressure compensation apparatus 12 within the loudspeaker cavity 22; 38. This is because air moving within the loudspeaker cavity 22; 38 (due to movement of the diaphragm 24; 32) is not restricted by the apparatus 12 to any significant degree, because the air can flow easily in the channels 58 formed between the plates 42.

The plates 42 of the pressure compensation apparatus 12 are identical. This can provide manufacturing advantages in that only one type of component is required to be manufactured in order to produce the plates 42. It will be appreciated, however, that in some situations it may be advantageous for the plates 42 to be of differing dimensions.

Figure 6:
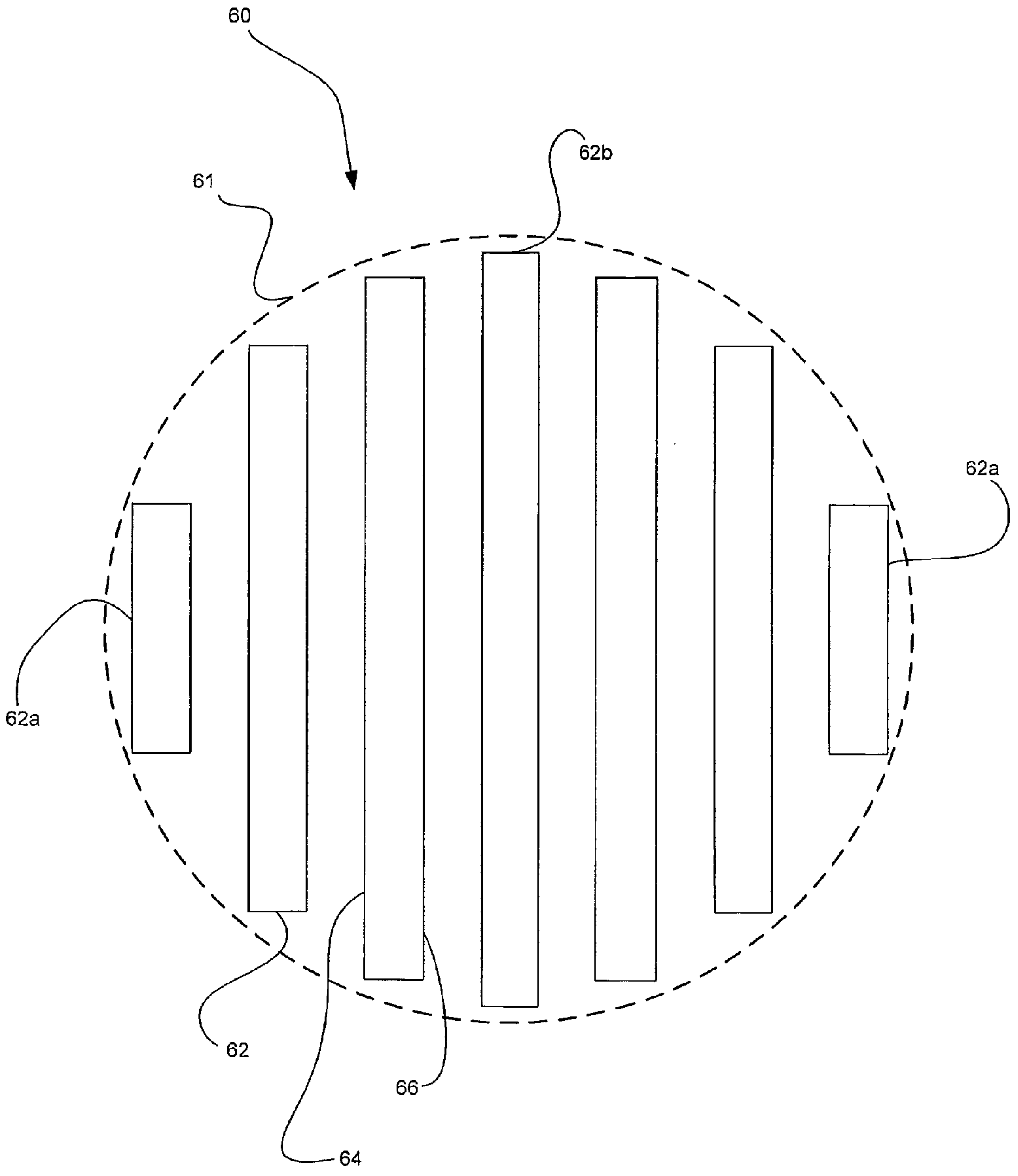
FIG. 6 shows a second embodiment of the apparatus arranged for compensating for pressure changes in an acoustic transducer.

FIG. 6 shows a schematic of a second embodiment of an apparatus 60 for compensating for pressure changes in an acoustic device. It should be understood that the pressure compensation apparatus 60 of FIG. 6 replaces the pressure compensation apparatus 12 shown included within the loudspeaker units 10, 30 in FIGS. 1 and 2. FIG. 6 depicts the diaphragm 61 of a loudspeaker unit viewed from the front, i.e. along the direction given by the arrow D1-D2 in FIG. 1. For purely illustrative purposes, the apparatus 60 is visible through the diaphragm 61. The diaphragm 60 has a substantially circular cross-section, and there is a substantially cylindrical cavity therebehind.

As with the embodiment described with reference to FIGS. 3 to 5, the pressure compensation apparatus 60 of FIG. 6 comprises a plurality of plates 62 each having two main surfaces 64, 66 arranged perpendicular to the diaphragm 61. The plurality of plates 62 are substantially the same as the plates 42 described with reference to the embodiment 12 of FIGS. 3 to 5. The plates 62 of FIG. 6 differ from those of FIGS. 3 to 5 in that the heights of the main surfaces 64, 66 of the plates differ from one plate to an adjacent plate. Here, the height of a main surface 64; 66 is defined as the largest dimension of the main surface that is parallel (or substantially parallel) to the plane of the diaphragm 61. The heights of the main surfaces 64, 66 of the plates 62 increase gradually from the plates at the extremities of the arrangement 62*a* to the plate (or plates) at the centre of the arrangement 62*b*. In this way, the apparatus fits more precisely within a cylindrical cavity formed by a diaphragm 61 having a circular cross-section. Put another way, the pressure compensation apparatus 60 may occupy a greater proportion of the volume of the cavity than would a corresponding non-cylindrical arrangement.

Figure 7:
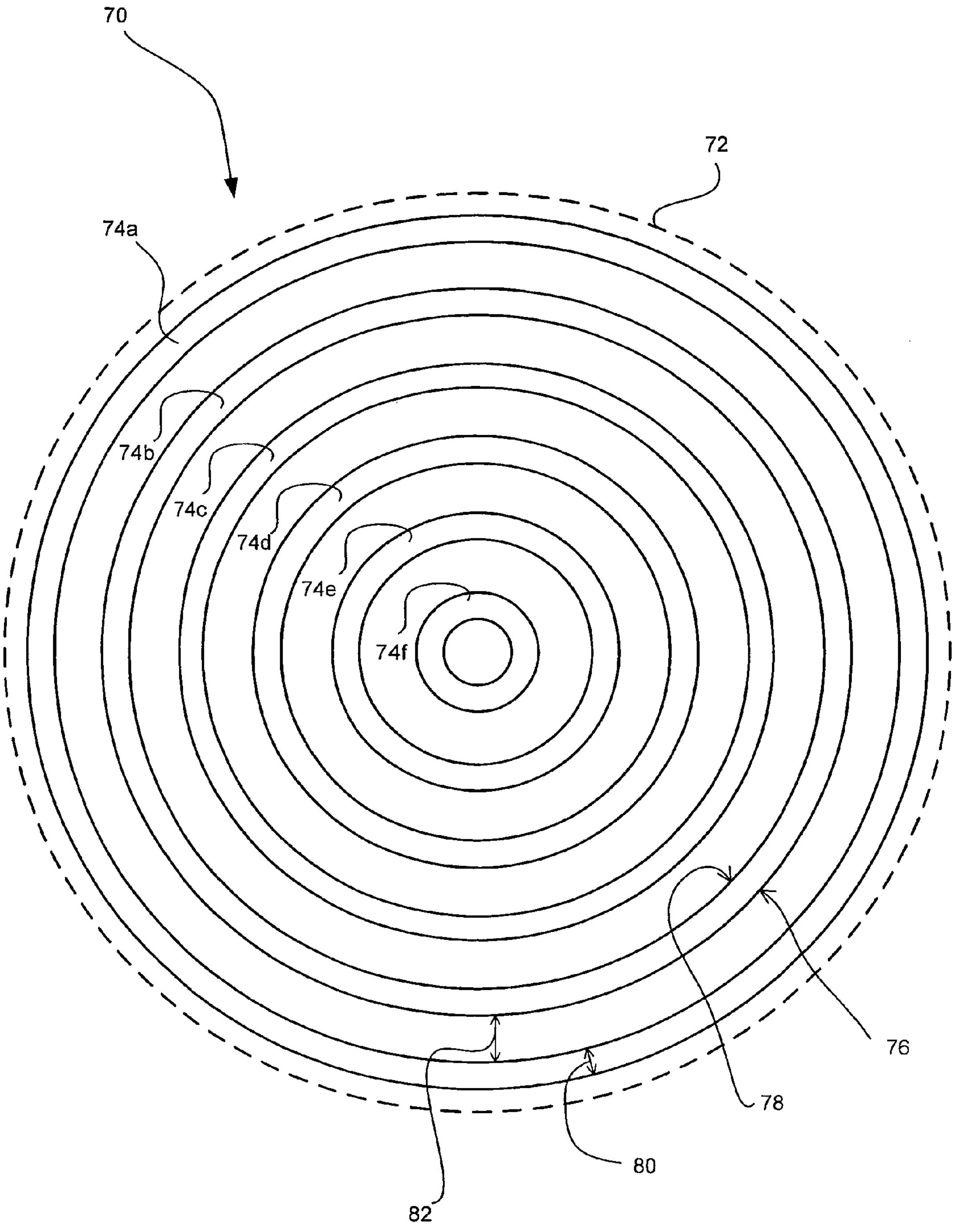
FIG. 7 shows a third embodiment of the apparatus arranged for compensating for pressure changes in an acoustic transducer system.

In FIGS. 1 to 6, the pressure compensation apparatus 12; 60 comprise substantially flat plates 42; 62. However, it should be appreciated that other configurations may also be suitable. FIG. 7 depicts an alternative embodiment of an apparatus 70 suitable for compensating for pressure changes in an acoustic device. It should be understood that the pressure compensation apparatus 70 of FIG. 7 replaces the pressure compensation apparatuses 12, 60 shown in FIGS. 3 to 6. FIG. 7 depicts the diaphragm 72 of a loudspeaker unit from the front i.e. along the direction given by the arrow D1-D2 in FIG. 1. For purely illustrative purposes, the pressure compensation apparatus 70 located in a cavity to the rear of the diaphragm 71 is visible through the diaphragm 71.

The pressure compensation apparatus 70 comprises a plurality of tube-shaped, or tubular, members 74. Each of the tubular members 74 has different diameter. Each tubular member 74 has two main surfaces 76, 78. The tubular members 74 are arranged concentrically. Thus, each tubular member 74, except for the tubular member having the largest diameter 74*a*, is located within the tubular member 74 having the next largest diameter. As such, at least one of the two main surfaces 76, 78 of each of the members 74 faces one of the two main surfaces 76, 78 of an adjacent one of the plurality of members 74. In this case, a first member 74 is adjacent to second member 74 if it immediately surrounds or is immediately contained by the second member 74. Each of the plurality of tubular members 74 is made of any suitable material. For instance, the material may be a rigid material having suitable damping qualities. The material may be molded plastic or silicon.

Each of the tubular members 74 has an associated wall thickness 80. The wall thickness 80 is the distance between a point on one of the main surfaces 76 and a radially corresponding point on the other main surface 78 of the member 74. The wall thicknesses 80 of each of the members 74 are substantially the same. It should be understood that it may be suitable for different members 74 to have different wall thicknesses 80.

The tubular members 74 are spaced apart from one another by a spacing distance 82. The spacing distance 82 is the distance between a point on one main surface 76 of one member 74 and a radially corresponding point on an opposing main surface 78 of an adjacent member 74. The tubular members are uniformly spaced apart such that the spacing distances 82 between each member 74 and its adjacent member/members 74 are equal. It should be appreciated that it may be suitable the members to be differently spaced apart.

Figure 8:
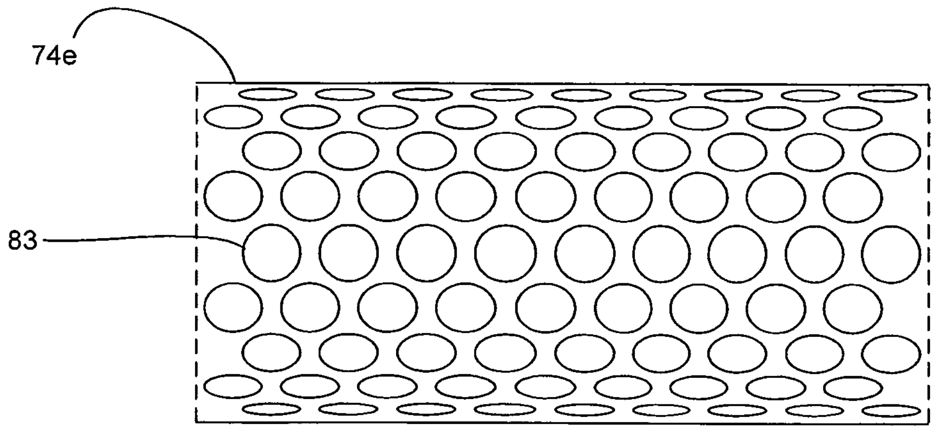
FIG. 8 is a side-view of a portion of the apparatus of FIG. 7.

FIG. 8 shows a side-view of one of the plurality of tubular members 74. Each of the main surfaces 76, 78 of the plurality of tubular members has a plurality of hollows 83 formed therein. The plurality of hollows 83 are arranged in a hexagonal array. That is, each hollow 83, except those located nearest to ends of the cylindrical members 74, is bordered by six other hollows 83. Although this arrangement allows the main surfaces 76, 78 to include the largest number of hollows 83, it should be understood that other arrangements may also be suitable. The hollows 83 are cylindrical in shape. However other shapes may also be suitable. The hollows may have a diameter in the range of 100 nm to 10 μm.

The interior surfaces of the hollows 83 include a plurality of nanotubes fixed thereon. The nanotubes may have a diameter of approximately 1 nm to 30 nm. The nanotubes 84 are arranged in the same way as in the pressure compensating apparatus shown in FIGS. 3 to 5 (see, in particular, FIG. 4). Thus, the nanotubes are oriented such that the lengths of the nanotubes are normal to the interior surface of the hollow. The word normal is used here to denote that the longitudinal axis of the nanotube is perpendicular to the surface at the location of the surface to which the nanotube is attached. Thus the nanotubes extend from the inner surface of the hollows towards a central axis that runs through the hollows. It will be appreciated that other orientations may also be appropriate. The nanotubes may be grown in situ or alternatively may be fixed to the inner surface of the hollow after growth.

It should be understood that the nanotubes may be omitted and instead a different suitable adsorbent material having a regular surface, for example graphite or a metal-organic framework may be used.

Figure 9:
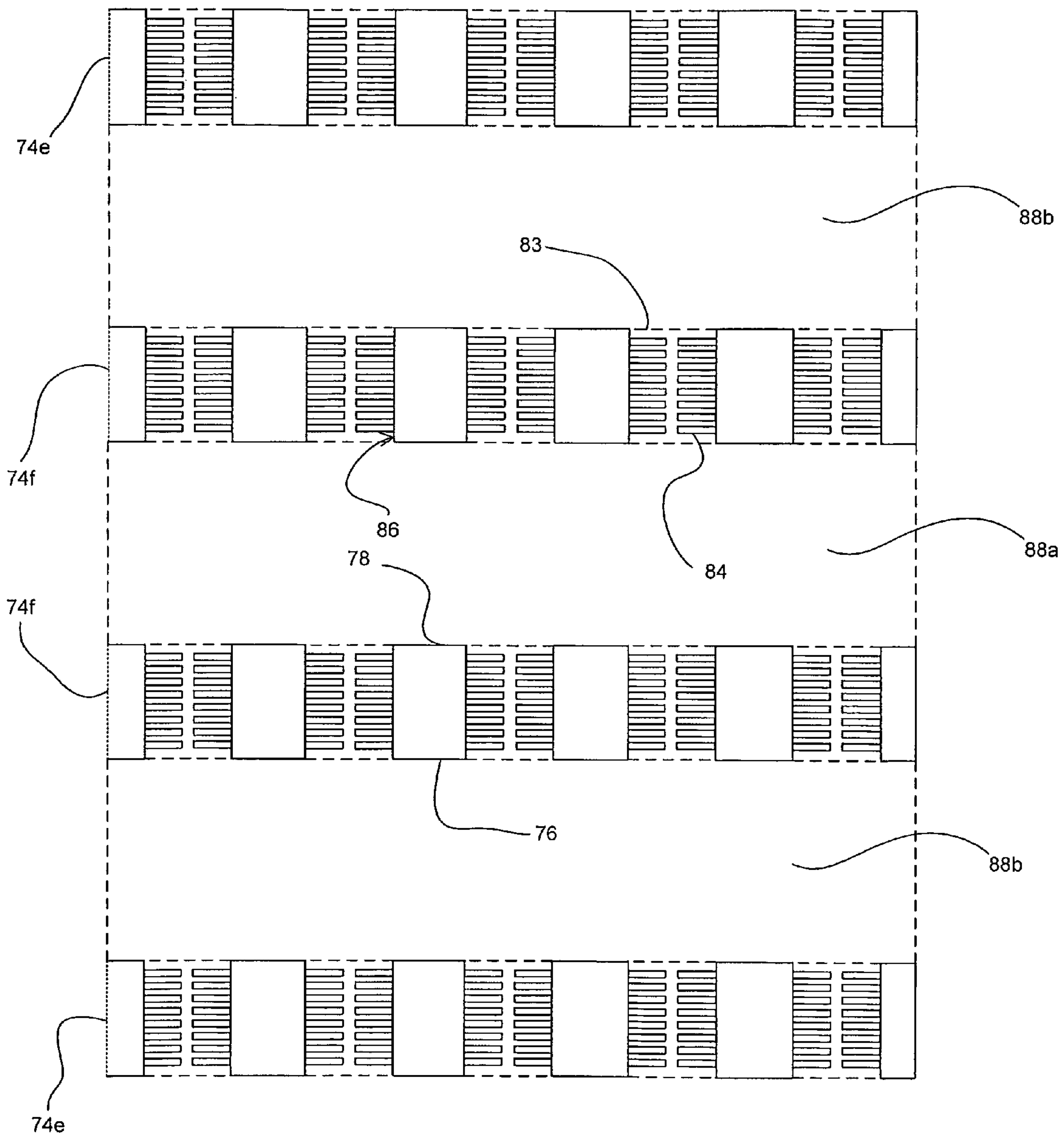
FIG. 9 is a cross-sectional view of the apparatus of FIG. 7.

FIG. 9 shows a cross-sectional view of a portion of the tubular member 74 shown in FIG. 8. The tubular member depicted in FIG. 8 is the member 74*e* of the apparatus 70 having the second smallest diameter, and thus the member 74*f* having the smallest diameter is located therein. Both the member 74*f* having the smallest diameter and the member 74*e* having the second smallest diameter are shown in FIG. 9. Each of the hollows 83 extends through the entire wall thickness 80 of its respective tubular member 74 from a first of the two main surfaces 76 to a second of the two main surfaces 78 of the member 74. Nanotubes 84 normal to the inner surfaces 86 of the hollows 83 are fixed at regular intervals along the entire length of the inner surfaces 86 of the plurality of hollows 83. The word normal is used here to denote that the longitudinal axis of the nanotube is perpendicular to the surface at the location of the surface to which the nanotube is attached. It should be appreciated that alternatively it may be suitable for the nanotubes 84 to be fixed normal to the inner surfaces 86 of the hollows 83 at irregular intervals.

The two tubular members 74*e*, 74*f* are spaced apart by the spacing distance 82, thus forming channels 88*a* between them. The tubular member 74*f* having the smallest diameter forms a channel 88*b* therein.

The tubular members 74 are arranged such that their main surfaces 76, 78 are perpendicular to the loudspeaker diaphragm 72. This provides a suitably low flow resistance due to the presence of the apparatus 70 within a loudspeaker cavity. This is because air moving within the loudspeaker cavity (due to movement of the diaphragm 72) is restricted by the apparatus 70 to a suitably low degree because it is able to flow easily within the channels 88 formed by the arrangement of the members 74.

Figure 10:
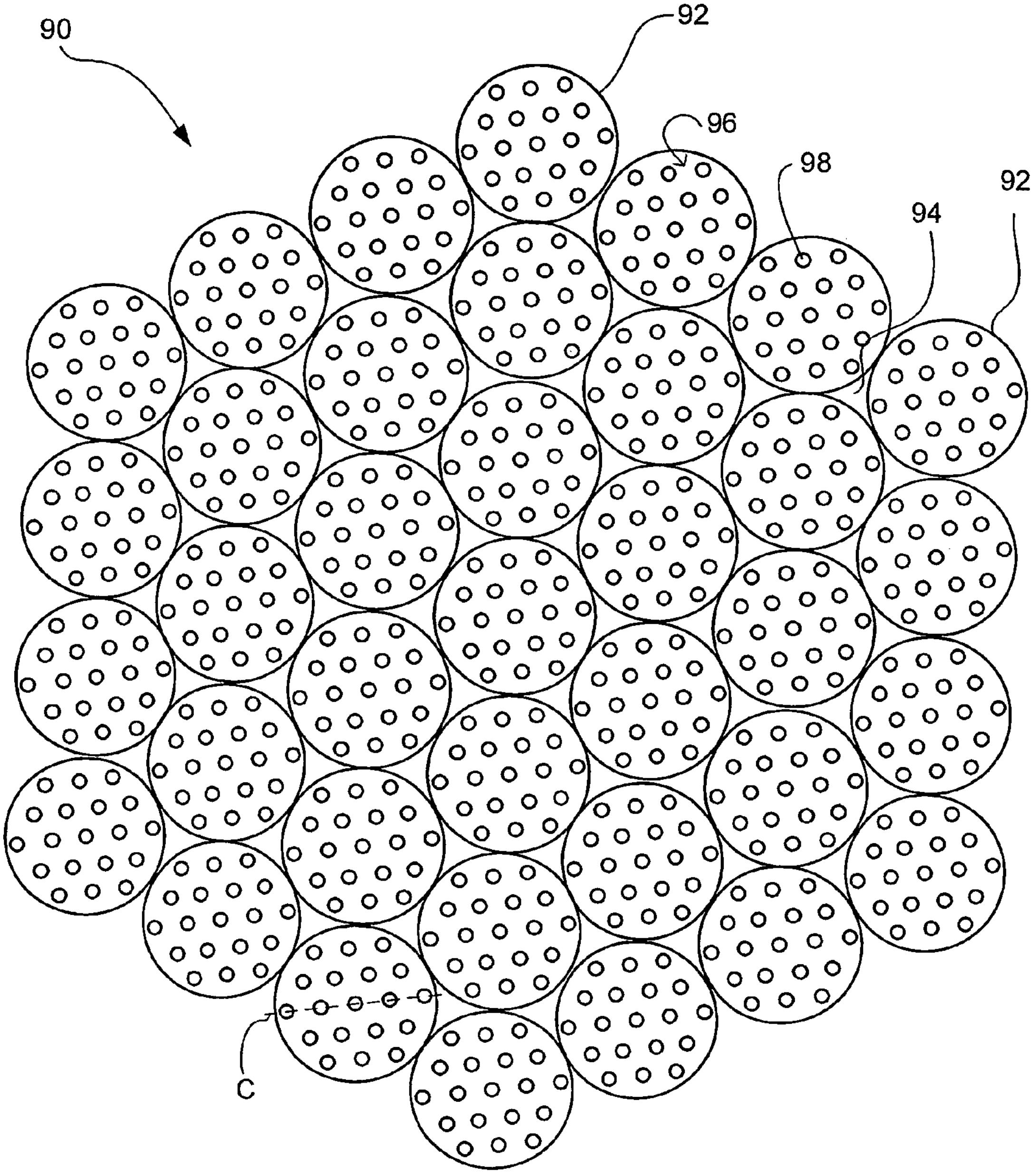
FIG. 10 shows a fourth embodiment of the apparatus arranged for compensating for pressure changes in an acoustic transducer system.

FIG. 10 shows a cross-sectional view of a fourth embodiment of an apparatus 90 suitable for compensating for pressure changes in an acoustic device. The apparatus 90 comprises a plurality of members 92. In this example the members 92 are spheres. It should be appreciated that other substantially spheroidal shapes may be suitable. Suitable substantially spheroidal shapes include spheres, oblate spheroids, ovate spheroids, prolate spheroids and the like. FIG. 10 depicts a single layer of spheres 92 arranged in a hexagonal array. It should be appreciated that this is just one of many configurations that may arise. For instance, the spheres 92 may be arranged in a non-regular configuration, or a partly-regular configuration, wherein some of the spheres 92 are arranged in a regular configuration and others of the spheres are arranged in a non-regular configuration. The apparatus 90 includes plural layers of spheres 92. The plural layers may be distinct. However, it should be appreciated that, instead, the layers may be indistinct from one another. The configuration may be one that results from plural spheres 92 being allowed to settle naturally, or through agitation, from a random introduction of the spheres 92 into a container or on a surface.

Due to the spherical nature of the members 92, any configuration results in channels 94 being formed between the members 92. In FIG. 10, the channels 94 are formed between a sphere 92 and two adjacent spheres 92. Channels are also formed between the members 92 when the members have a different substantially spheroidal shape.

The surface 96 of each sphere 92 is provided with a plurality of holes or hollows 98 formed therein. The hollows 98 have circular openings. It will be appreciated, however, that other shapes may also be suitable. The openings may have a diameter of approximately 0.1 to 10 μm. The diameter of the hollows 98 may be in the range of 1% to 10% of the diameter of the spheres 92. The hollows 98 are arranged in a generally hexagonal array. It should be understood, however, that other arrangements may also be suitable.

Figure 11:
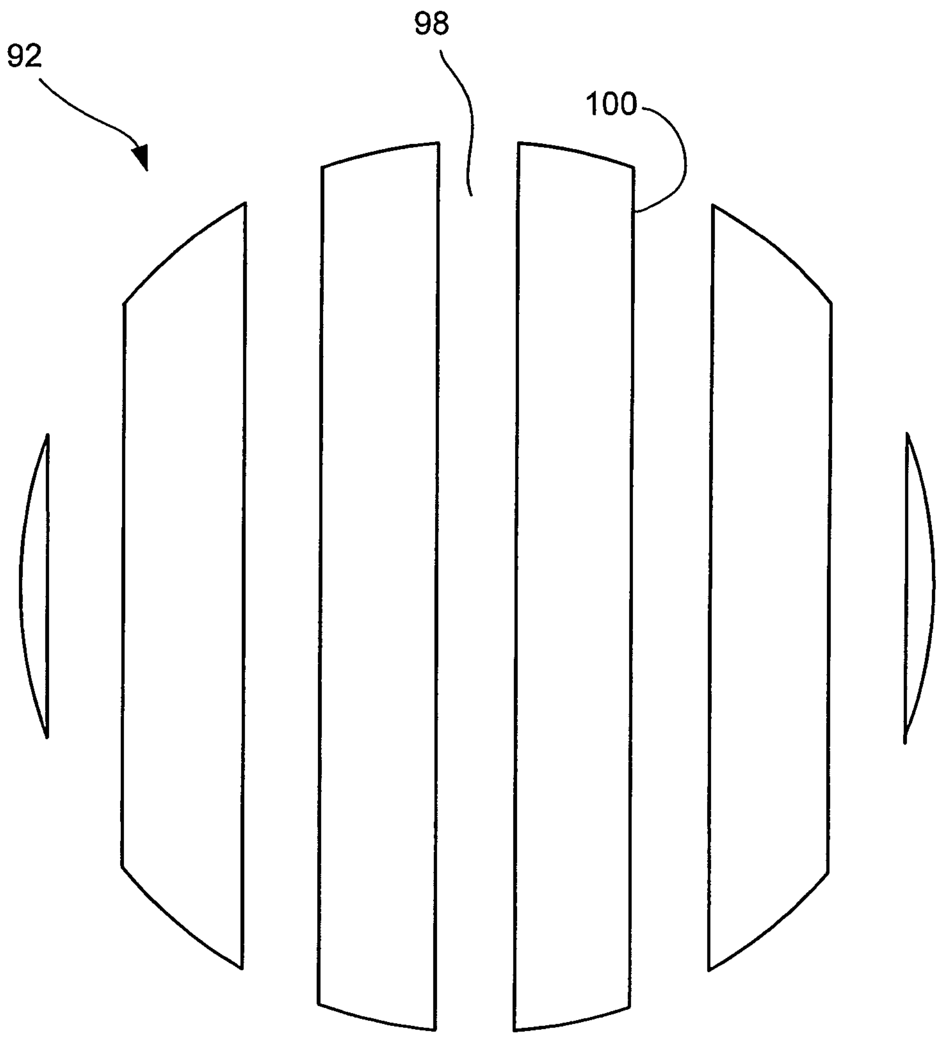
FIG. 11 is a cross-sectional view of a single component of the apparatus of FIG. 10.

As can be seen in FIG. 11, which shows a cross-sectional view (along the line denoted by the letter C) of a single sphere 92, the hollows 98 are formed through the spheres 92, thus forming channels, holes or ducts. The channels, holes or ducts 98 are cylindrical in shape. They have a substantially uniform diameter. Alternatively the hollows may be formed only part way through the spheres 92. The hollows 98 are parallel to one another. It should be understood that the hollows may instead not be parallel. In FIG. 10, the spheres 92 are depicted as being aligned, such that the hollows 98 of one sphere 92 are parallel to hollows of another sphere. However, it should be appreciated that the spheres 92 may not be aligned thus, and that the spheres 92 instead may be aligned irregularly or randomly.

Although not depicted in FIGS. 10 and 11, inner surfaces 100 of the hollows 98 are provided with an adsorbent material having a regular structure, for example, carbon nanotubes, metal organic frameworks or graphite.

If the adsorbent material comprises carbon nanotubes, a plurality of nanotubes is fixed around the interior surface 100 of each of the hollows 98. The nanotubes may have a diameter of approximately 1 nm to 30 nm. The nanotubes are oriented such that their length is normal to the inner surfaces 100 of the hollows 98. The word normal is used here to denote that the longitudinal axis of the nanotube is perpendicular to the surface at the location of the surface to which the nanotube is attached. Thus, the nanotubes extend from the interior surfaces 100 of the plurality of hollows 98 towards central axes of the plurality of hollows 98. It will be appreciated that other orientations may also be appropriate. The nanotubes may be grown in situ or alternatively may be fixed to the inner surfaces 100 of the hollows 98 after growth.

The nanotubes normal to the inner surfaces of the hollows 98 are fixed at regular intervals along the entire length of the inner surfaces 100 of the plurality of hollows 98. It should be appreciated that alternatively it may be suitable for the nanotubes to be fixed normal to the inner surfaces 100 of the hollows 98 at irregular intervals.

It should be understood that the nanotubes may be omitted and instead a different suitable adsorbent material having a regular surface, for example graphite or a metal-organic framework may be used. The graphite or metal-organic framework may be provided in any suitable way. For instance, the graphite or metal-organic material may be provided as a layer on the surface of the hollows 98.

The members 92 being spheres allows design freedom. This is because, depending on the size of the cavity, any suitable number of spheres 92 may be selected for use. Similarly, the spheres 92 may be arranged easily to fit into any number of different cavity shapes. Because the structure of the spheres 92 is known, the adsorbency of the spheres 92 also is known. Thus, a desired adsorbency can be obtained by using an appropriate number of spheres. For instance, assuming that a sphere has a certain adsorbency and 2000 times that adsorbency is required for a loudspeaker or other acoustic transducer system, the designer can specify that around 2000 spheres are used in the loudspeaker, and in this way can be assured that the desired acoustic properties will be present in the loudspeaker.

Figure 12:
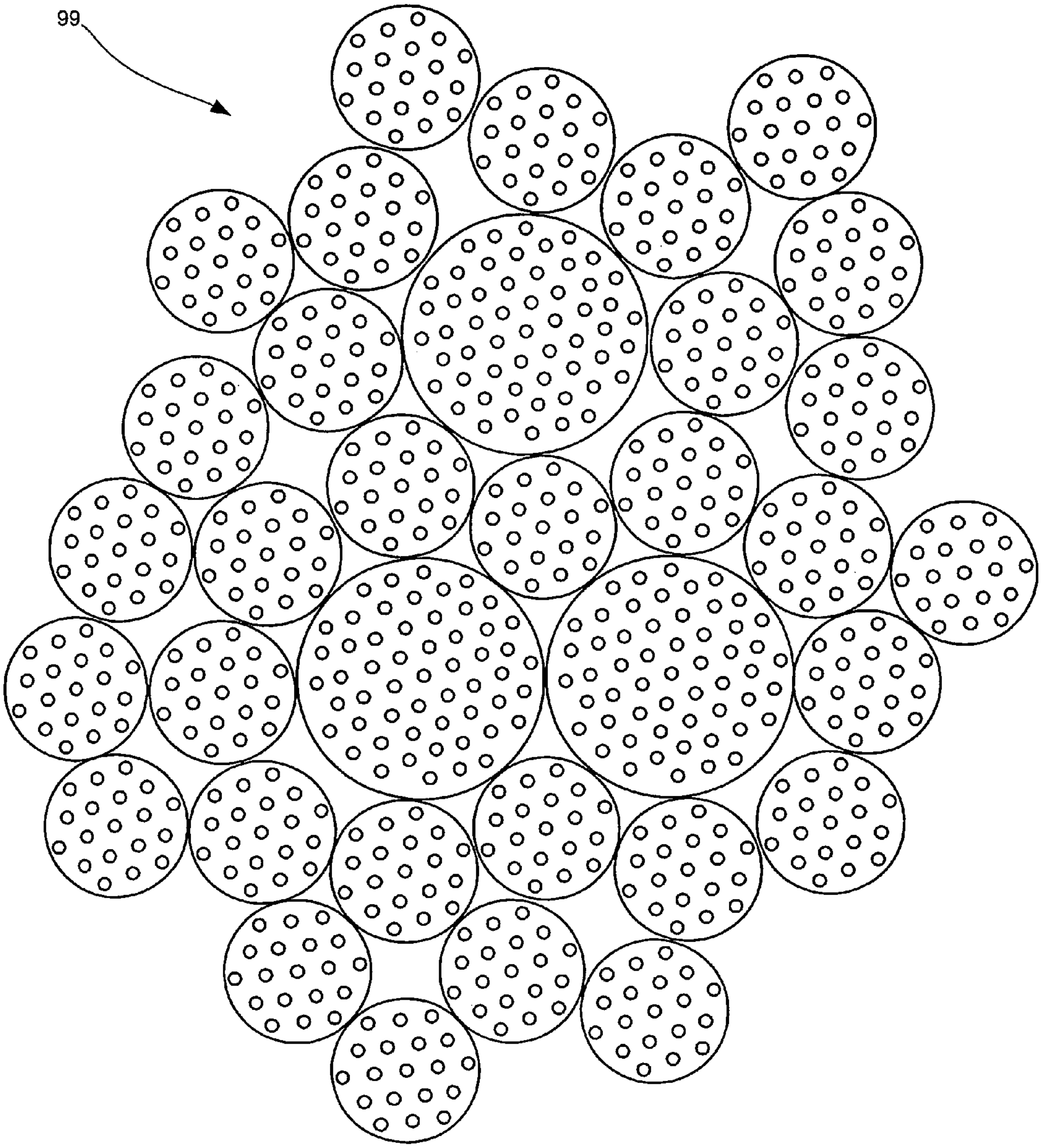
FIG. 12 shows a fifth embodiment of the apparatus arranged for compensating for pressure changes in an acoustic transducer system.

In FIG. 10, each of the members 92 of the apparatus 90 is substantially the same size the others. Alternatively, the members 92 may be differently sized. This can be seen in FIG. 12, in which the pressure compensation 99 comprises differently sized members 92.

Figure 13:
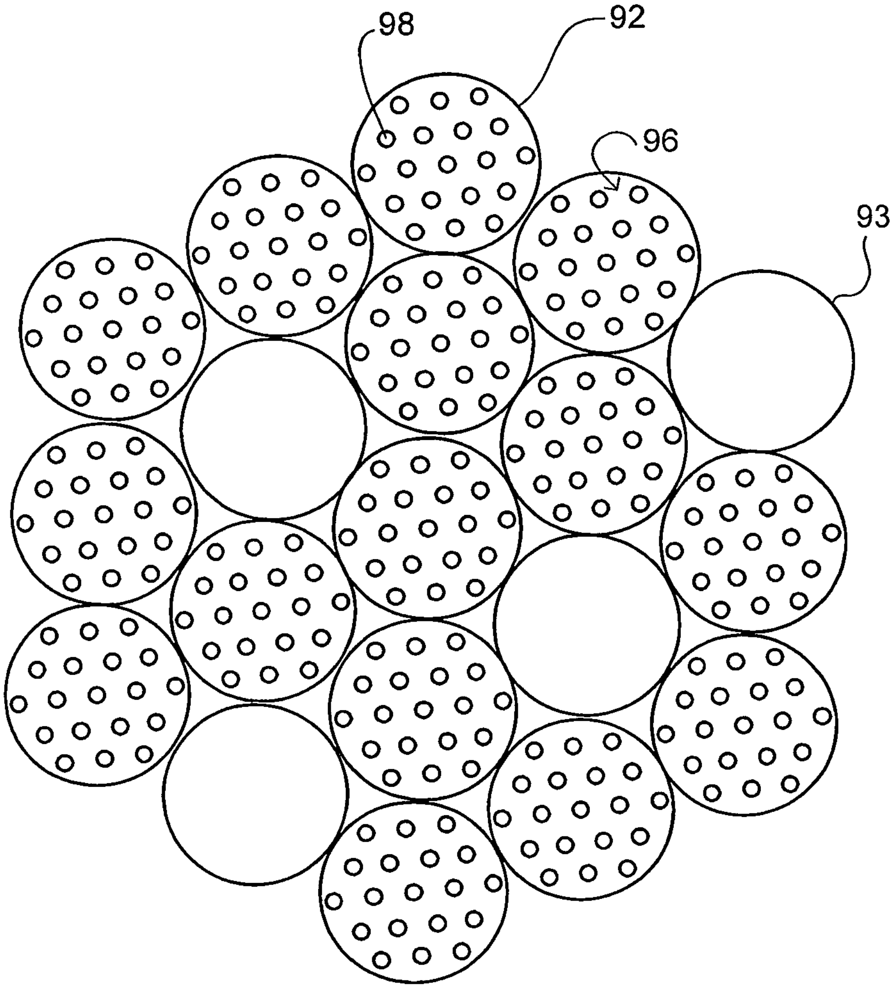
FIG. 13 shows a sixth embodiment of the apparatus arranged for compensating for pressure changes in an acoustic transducer system.

In other embodiments, such as that shown in FIG. 13, the pressure compensation apparatus 90 includes non-adsorbent blank, or dummy, members 93. The blank members 93 do not support adsorbent material. The blank members may or may not have hollows 98 formed therein. The blank members 93 may be the same size as the adsorbing members 92. Alternatively, the blank members 93 may be smaller or larger than the adsorbing members 92. Alternatively, the blank members 93 and the adsorbing members may be of various sizes.

The inclusion of members (either blank or adsorbing) of different sizes may allow the ratio of adsorbing surface area versus air-flow resistance caused by the presence of the apparatus within the cavity to take a desired value.

The adsorbing members 92 and/or the blank members 93 may be substantially non-deformable. As such, the members 92 may retain their original shape even when subjected to external forces. Here, the members may be formed of molded plastic or silicon.

Figure 14:
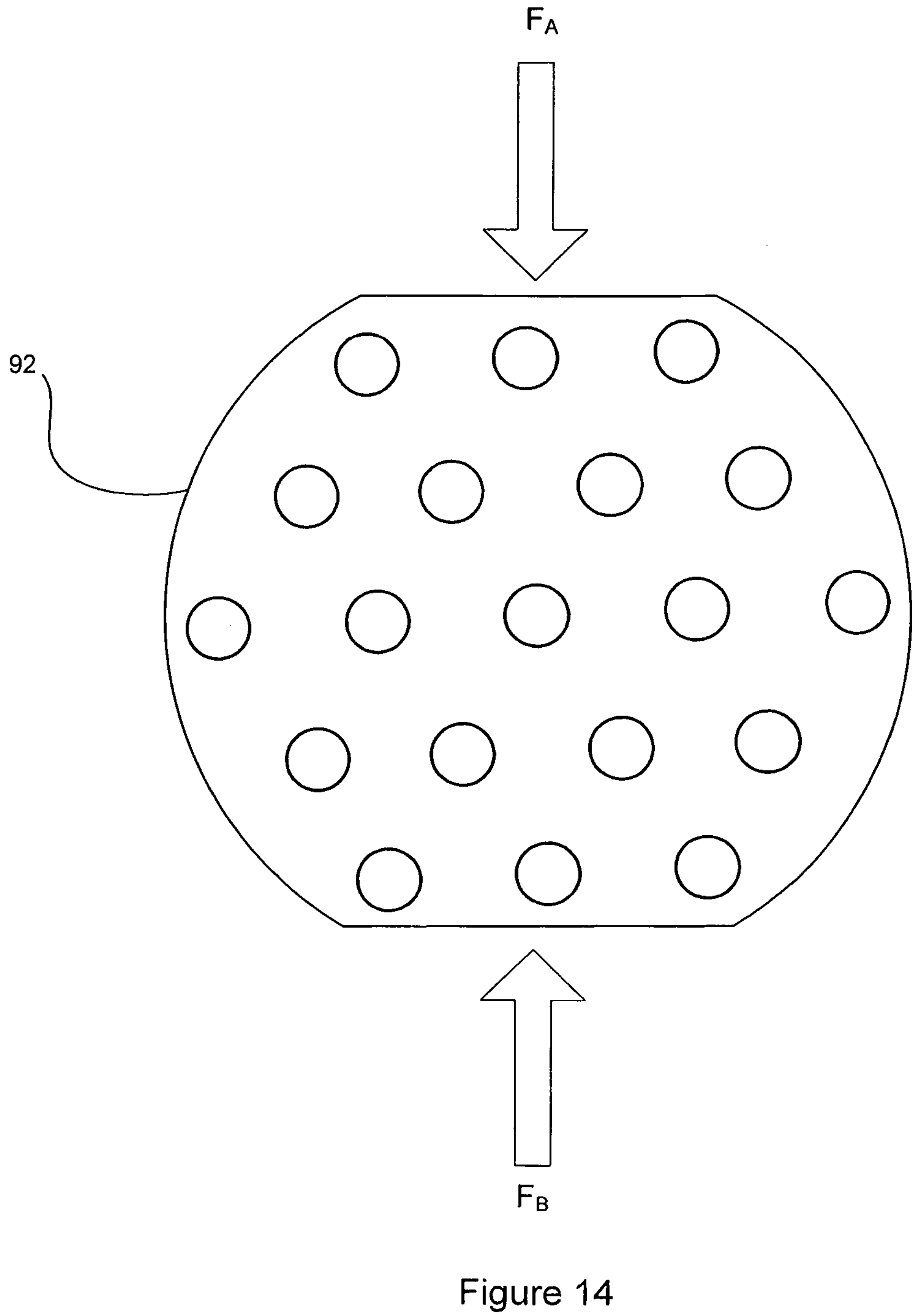
FIG. 14 shows an alternative embodiment of a single component of the apparatuses of any of FIGS. 10 to 13.

Alternatively, the members 92 may be deformable. Consequently, the member 92 may deform when subjected to external forces. FIG. 14 shows a deformable member 92 deforming, as a result of forces exerted from above and below ($F_A$ and $F_B$ respectively). Deformability may allow the members to fit more exactly within a cavity. The members 92 may be elastically deformable. In this case, the member of FIG. 12 may return to its original shape when the external forces are removed.

Figure 15A:
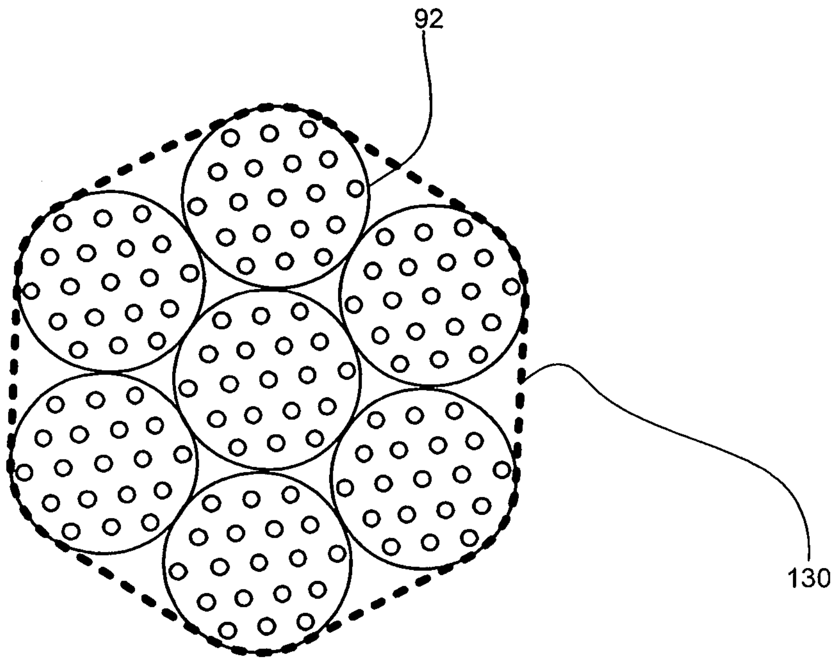
FIGS. 15A and 15B each show the apparatus of FIG. 10 contained within a receptacle.
Figure 15B:
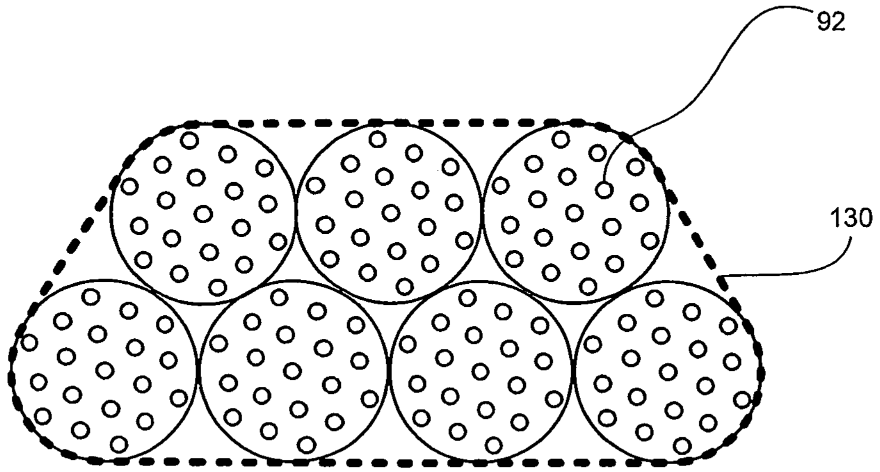

FIGS. 15A and 15B each show a simplified schematic of the members 92 of FIGS. 10 and 11 contained within a receptacle 130. The receptacle 130 comprises a porous bag. The receptacle 130 is porous because it includes holes sufficiently large to allow air to permeate therethrough. As such, the bag 130 provides minimal resistance to the flow of air through the bag 130.

The member-filled bag 130 is placed in the cavity of a loudspeaker. The bag 130 prevents the members from escaping the cavity and entering areas in which they are not wanted.

The bag 130 is flexible, such that the members 92 are able to move freely in three dimensions within the bag 130. Consequently, the members 92 may move freely from a first configuration, as shown in FIG. 13A to a second as shown in FIG. 13B. The bag 130 may be elastic. As such the bag may conform to the exterior shape of the configuration of members therein. The bag 130 may comprise, for example, a synthetic fiber, or a synthetic cloth similar for example to the cloth commonly used in tea bags.

The size of the bag may be selected based on the volume of the speaker cavity. As such, the size of the bag may be selected so to contain a number of members sufficient to substantially fill the cavity. Alternatively, the size of the bag 130 may not depend on the volume of the cavity. As such, if a cavity is able to contain more members than can be contained by a single bag 130, more than one bag may be placed in the cavity. Conversely, if a cavity is able to contain fewer members than can be contained by a bag, the bag may be only partially filled with adsorbing members. Bags 130 may be produced in a range of sizes, each size being able to contain a different number of adsorbing members. As such, an appropriate bag or combination of bags of different sizes may be chosen in order to sufficiently fill the speaker cavity with adsorbing members.

Although FIGS. 15A and 15B show the receptacle 130 filled with uniformly sized adsorbing members 92, it will be appreciated that differently sized members (such as those depicted in FIG. 12, 13 or 14) may be located within the receptacle 130.

Each of the pressure compensation apparatuses 12, 60, 70, 90, 99 can be compared to the structure of a human lung, which is known to be particularly effective at absorbing gas. The channels 58; 88; 94 formed between the plates 42; 62 or members 74; 92 might be compared to the bronchi of the lung. The hollows 50; 80; 98 formed in the surfaces of the plates/members might be compared to the bronchioles of the lung, and the adsorbent material, such as the nanotubes, may be compared to the alveoli.

The branching structure of the apparatus attempts to provide a suitably high adsorbing surface area, while at the same time ensuring suitably low viscous losses within the cavity. The ratio of the adsorbing surface area of the apparatus to overall surface area of an equivalently sized solid structure is very large. By way of example, a pressure compensation apparatus having a generally cubic external surface shape will now be discussed. This apparatus is substantially the same as that shown in and described with reference to FIG. 3. In the following:

- the apparatus has a side length L;
- the apparatus is comprised of plural plates;
- each of the plates has a uniform thickness 1;
- the plates are spaced apart from one another by a distance d;
- each plate is provided with plural circular hollows;
- the plural hollows are formed in a hexagonal array;
- each hollow extends through the thickness of the plate;
- the opening of each hollow has a radius a; and
- the centers of the hollows are spaced apart from the centers of adjacent hollows by a distance p.

The surface area of a solid equivalently sized cube is given by:

$$A_{cube}=6L^2$$

The total internal surface area of the plural hollows is given by:

$$A_{holes} = \frac{4\pi alL^3}{\sqrt{3}\,(l+d)p^2}$$

Thus, the ratio between the surface area of the holes and the surface area of the cube is:

$$\text{Ratio} = \frac{A_{holes}}{A_{cube}} = \frac{2\pi alL}{3\sqrt{3}\,(l+d)p^2}$$

If, for example, L=1 cm, d=l=0.25 mm, a=1 μm, p=4 μm, then $A_{holes}$=0.227 $m^2$ and Ratio=378. The provision of nanotubes on the interior surfaces of the hollows increases the ratio between the surface area of the holes and the surface area of the cube by up to 100 times.

Consequently, by utilizing pressure compensating apparatus such as those 12, 60, 70; 90 described above, having such high adsorbency coupled with small volume, within the cavity it is possible to reduce significantly reduce the size of the cavity compared to a corresponding conventional arrangement. This reduction in size, coupled with the relatively low viscous losses resulting from the arrangement of the pressure compensation apparatus, means that it is possible to situate the cavity between the magnet and the diaphragm, instead of to the rear of the magnet as is convention in current loudspeaker design. In the field of mobile devices, this means that one loudspeaker module design is suitable for a number of different devices as there is no need to design the mobile devices to accommodate a rear cavity. Furthermore, pressure compensation apparatus constructed in accordance with the invention may enable transducers (for both mobile and other types of devices) to be designed for greater efficiency, lower distortion, better low frequency response and satisfactory response flatness instead of to obtain merely a specified loudness with a small cavity.

Figure 16:
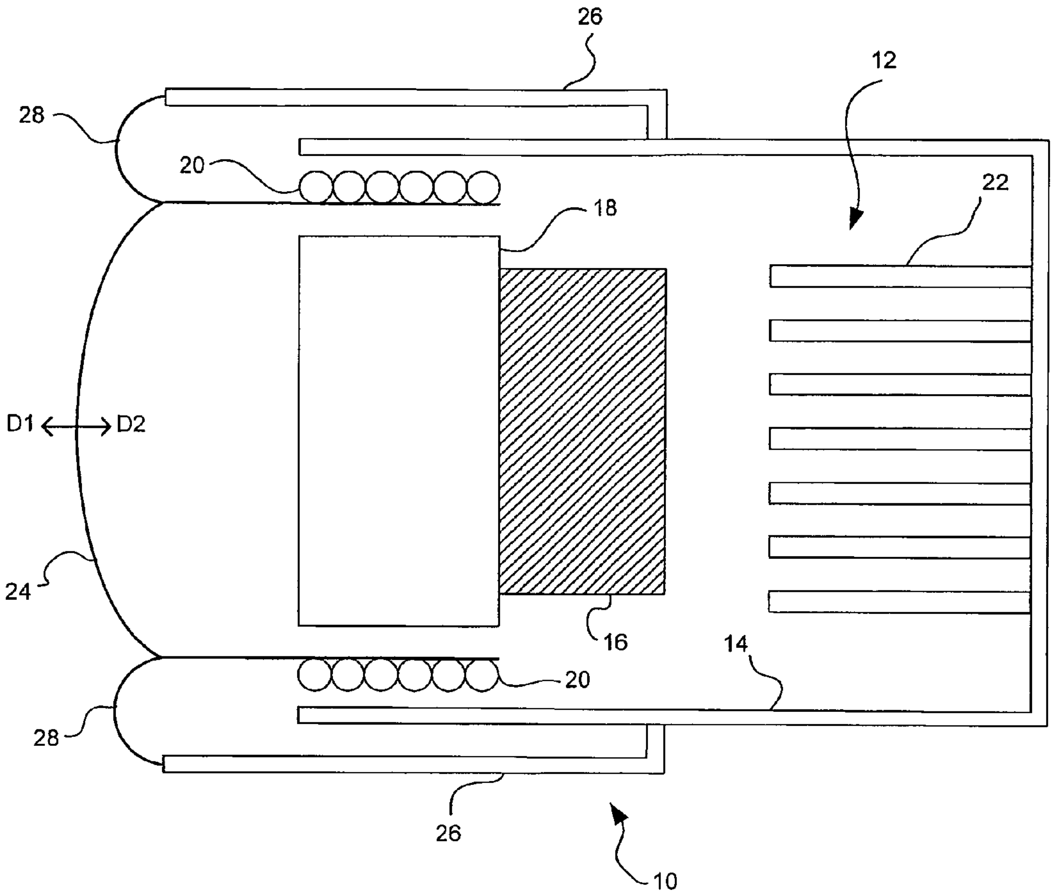
FIG. 16 is a schematic cross-sectional view of an alternative configuration of an electrodynamic loudspeaker unit including apparatus arranged for compensating for pressure changes in an acoustic transducer system.

As described above, in the loudspeaker unit 10 of FIG. 1, the cavity 22 is formed between the pole piece 18 and the diaphragm 24, the pressure compensation apparatus 12 being located therein. It will be appreciated that the pressure compensation apparatus 12 may alternatively be located in a cavity located at the rear of the magnet 30. This is illustrated in FIG. 16.

It will also be appreciated that the pressure compensation apparatus 12 may instead be situated in a cavity formed surrounding the main housing. This could be termed a side cavity. The side cavity may be additional to another cavity. The sound pressure from the rear of the diaphragm may be transferred to the additional cavity via openings in a structure separating the volume behind the diaphragm and the side cavity. This can be termed 'side firing'. This can allow the loudspeaker unit to have a shorter front to back dimension, albeit at the expense of a larger side to side dimension. The cavity containing the pressure compensation apparatus 12 may, in the case of a moving coil apparatus, be positioned around the magnet 16 and/or the pole piece 18 in a common sealed housing. Using side cavities can allow the depth (front to back dimension) of piezo and electrostatic transducer arrangements can be reduced for a given adsorbency.

Figure 17:
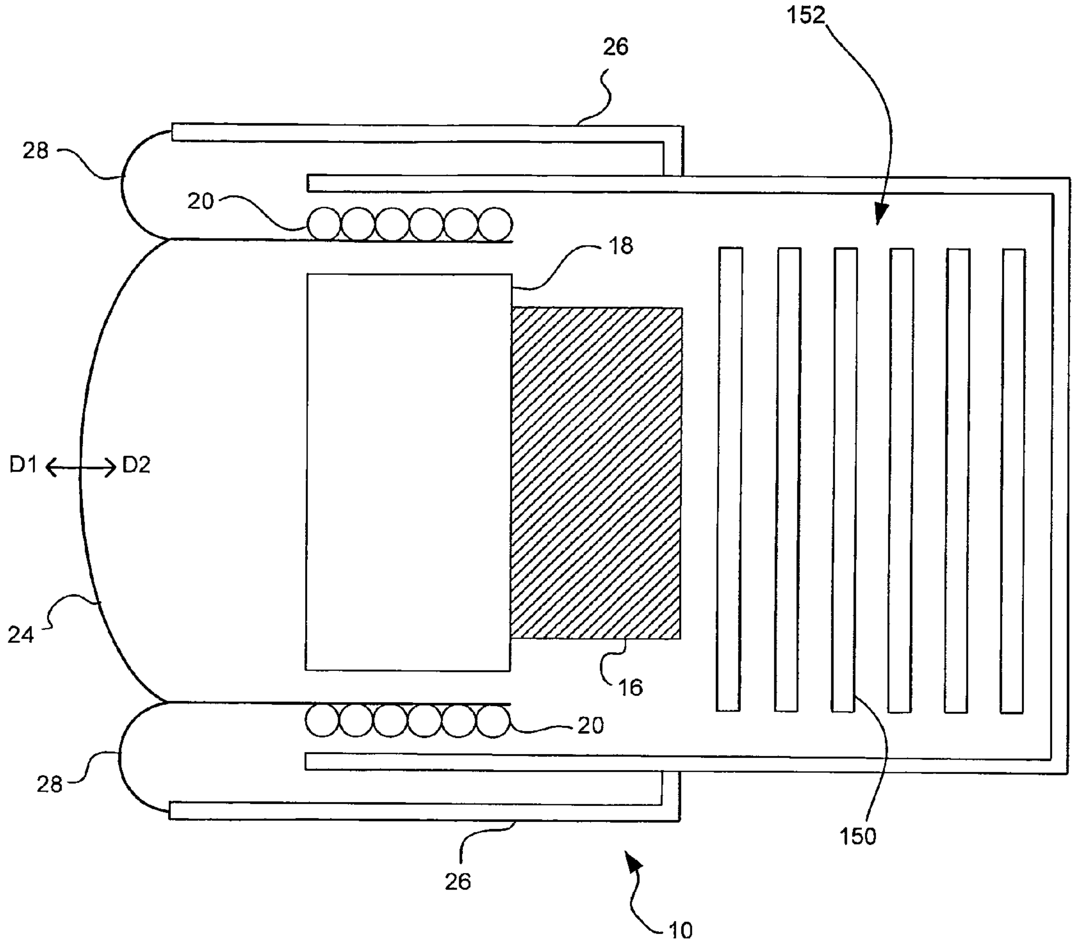
FIG. 17 is a schematic cross-sectional view of another alternative configuration of an electrodynamic loudspeaker unit including apparatus arranged for compensating for pressure changes in an acoustic transducer system.

In FIGS. 1 to 3 and 16, the plates 42 of the pressure compensation apparatus are arranged such that the planes of the plates 42 are substantially perpendicular to the plane of the diaphragm. Alternatively, however, the planes of the plates 42 may be parallel to the plane of the diaphragm. One such embodiment is shown in FIG. 17. The plates 150 of the pressure compensation apparatus 152 may be the same as the plates 42 of FIGS. 1 to 3 and 16. As such, air may flow between the plates 152 and also through the hollows formed therein.

As an alternative, some of the plates may be blank, or dummy, plates. Blank plates do not contain hollows supporting adsorbing material formed therein. This may allow the ratio of adsorbing surface area versus air flow resistance to be optimized.

Figure 18A:
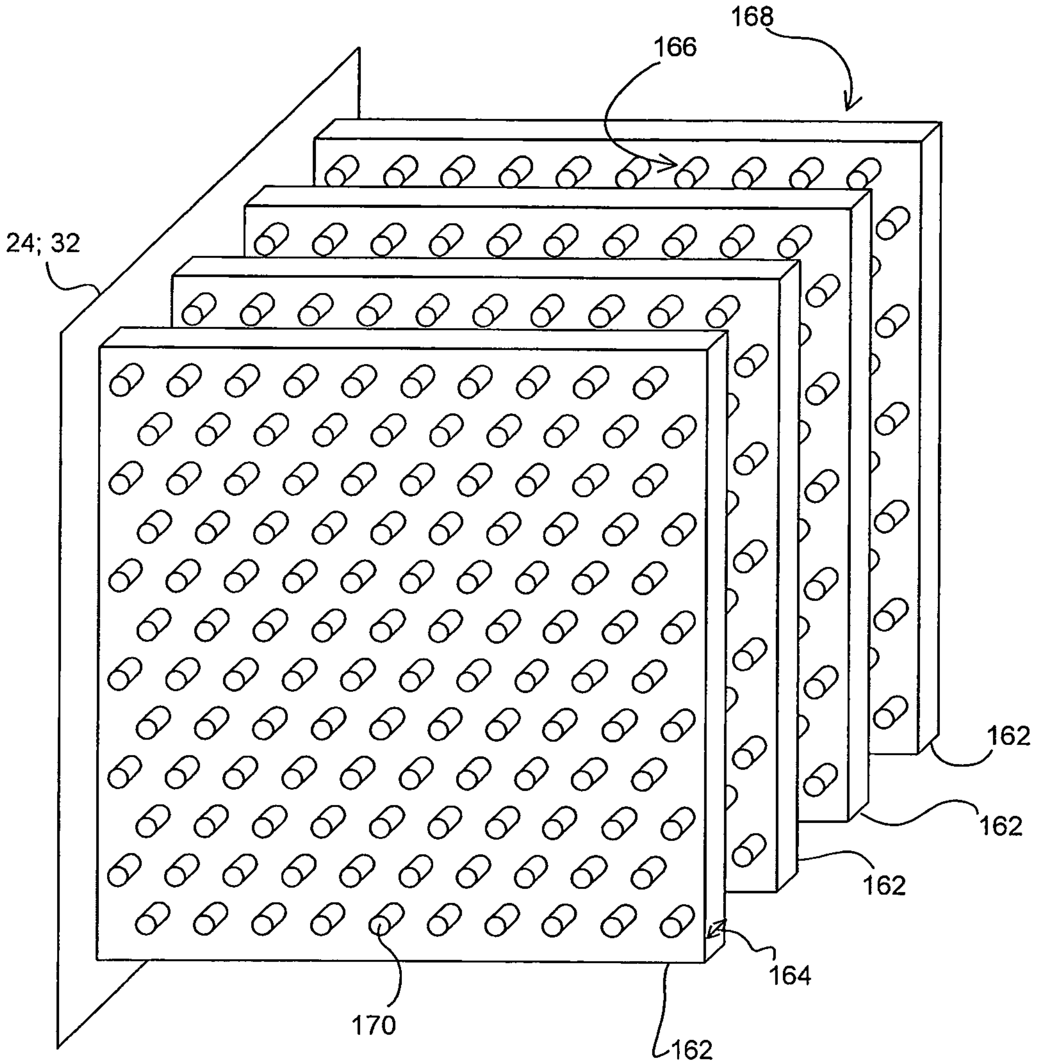
FIGS. 18A and 18B show a three-dimensional view and a plan view respectively of a seventh embodiment of apparatus arranged for compensating for pressure changes in an acoustic transducer system.
Figure 18B:
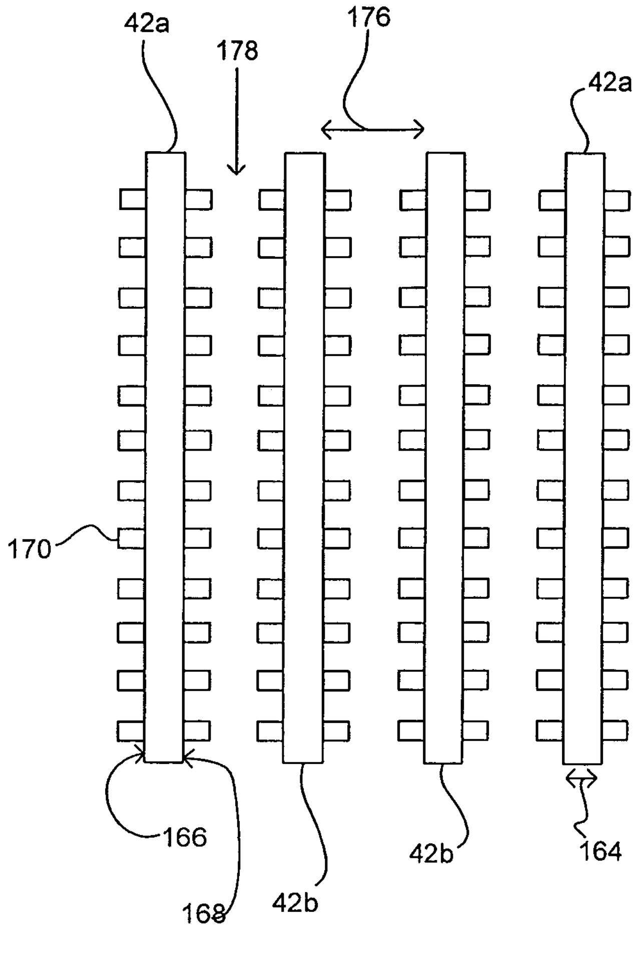

FIGS. 18A and 18B show an alternative embodiment of a pressure compensation apparatus 160. The pressure compensation apparatus 160 comprises a plurality of plates 162. In the embodiment of FIGS. 18A and 18B, there are four plates. However, the apparatus 160 alternatively could contain any number of plates 162.

The plates 162 have a substantially uniform thickness 164. The plates 162 have two opposite main surfaces 166, 168 that are parallel to one another. The main surfaces 166, 168 each have a rectangular shape. It should be understood that the plates 162 alternatively may have non-uniform thicknesses. If the plates 162 are of non-uniform thickness, it should be understood that the two main surfaces 166, 168 may not be exactly parallel but instead may be substantially parallel. Similarly, it should be understood that the main surfaces 166, 168 may have a different shape, for example square, circular or triangular. The plates 162 may comprise any suitable material. For instance, the material may be a rigid material having suitable damping qualities, such as to ameliorate or minimize internal vibration modes. The material may be molded plastic or silicon.

Each of the main surfaces 166, 168 has a plurality of protuberances 170 provided thereon. In FIGS. 18A and 18B, it can be seen that the protuberances 170 are substantially cylindrical. However, it should be appreciated that other shapes also may be appropriate. The plurality of protuberances 170 is arranged in a hexagonal array. That is, each protuberance 120, except those located nearest to edges of the plates 162, is bordered by six other protuberances 120 that are equidistant from the protuberance 120. Although this arrangement allows the main surfaces 46, 48 to include the largest number of protuberance 120 per unit area for a given separation between adjacent protuberances, it should be understood that other arrangements may also be suitable.

Figure 19A:
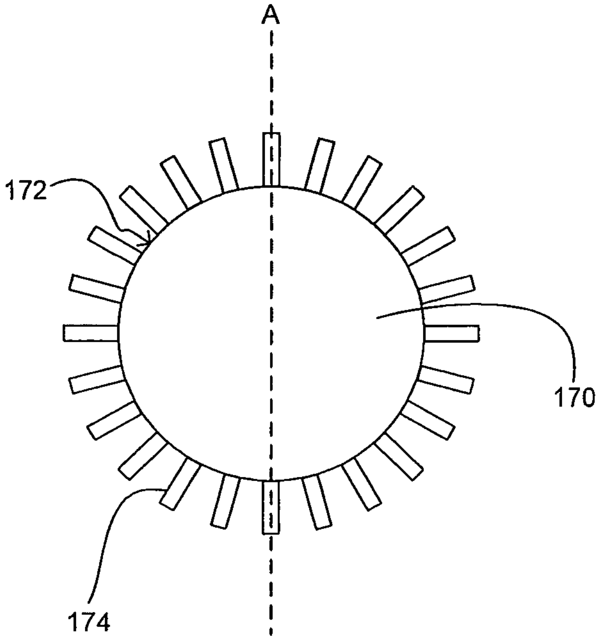
FIG. 19A is an enlarged view of a part of the apparatus of FIGS. 18A and 18B.

FIG. 19A is an enlarged end-on view of one of the protuberances 170 provided on of one of the main surfaces 166, 168 of one of the plates 162. The protuberances 170 may have a diameter in the range of 100 nm to 10 μm. Fixed to the exterior surface 172 of each of the protuberances 170 are a plurality of carbon nanotubes 174. The nanotubes 174 may have a diameter of approximately 1 nm to 30 nm. The nanotubes 174 are oriented such that their lengths are normal to the exterior surfaces 172 of the protuberances 170. The word normal is used here to denote that the longitudinal axis of the nanotube is perpendicular to the surface at the location of the surface to which the nanotube is attached. Thus, the nanotubes 174 extend from the exterior surfaces 172 of the plurality of protuberances 170 away from central axes (perpendicular to FIG. 19A) of the protuberances 170. It will be appreciated that other orientations may also be appropriate. The nanotubes 174 may evenly spaced around the exterior surfaces 172 of the protuberances 170. The nanotubes 174 may be grown in situ or alternatively may be fixed to the exterior surfaces 172 of the protuberances 170 after growth.

Figure 19B:
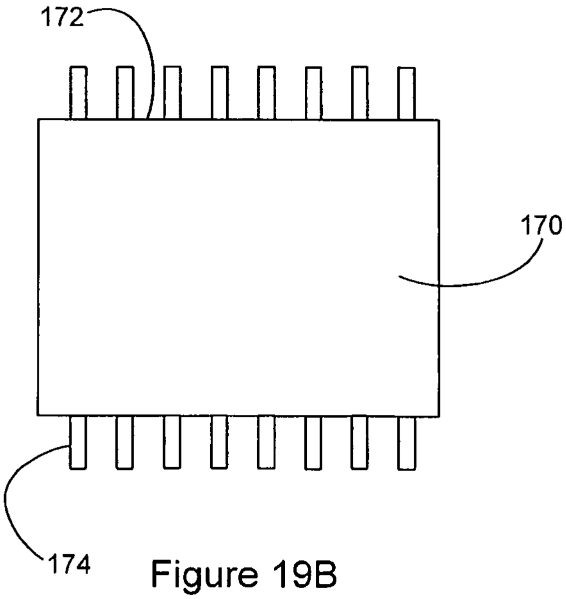
FIG. 19B is a cross-sectional view through the part of the apparatus shown in FIG. 19A.

FIG. 19B shows a cross-sectional view through the protuberance (along the line denoted A) of FIG. 19A. Nanotubes 174 normal to the exterior surface 172 of the protuberances 170 are fixed at regular intervals along the entire length of the exterior surfaces 172 of the plurality of protuberances 170. It should be appreciated that alternatively it may be suitable for the nanotubes to be fixed to the exterior surfaces 172 of the protuberances 170 at irregular intervals.

It should be understood that the nanotubes 174 may be omitted and instead a different suitable adsorbent material having a regular surface, for example graphite or a metal-organic framework, may be used. The graphite or metal-organic framework may be provided in any suitable way. For instance, the graphite or metal-organic material may be provided as a layer on the surface of the protuberances 170.

Referring again to FIGS. 18A and 18B, the plurality of plates 162 are arranged such that at least one of the two main surfaces 166, 168 of each of the plates 162 faces one of the two main surfaces 166, 168 of an adjacent one of the plurality of plates 162. In the case of plates 162*a* positioned at either end of the arrangement, only one of the main surfaces 166, 168 faces one of the main surfaces 166, 168 of an adjacent plate 162. In the case of the other plates 162*b* of the plurality, each of the two main surfaces 166, 168 faces a main surface of an adjacent plate 162.

In the pressure compensation apparatus 160 of FIGS. 18A and 18B, the plates 162 are arranged parallel to one another. However, it should be appreciated that an arrangement wherein the plates 162 are not parallel may also be suitable. The plates 162 are spaced apart from each other by a distance 176, thus forming channels 178 therebetween. The distance 176 may be, for example, between 10 μm and 100 μm.

In the apparatus of FIGS. 18A and 18B, the plates 162 are uniformly spaced apart from each other. However, it should be appreciated that it may be suitable for the plates 162 to be spaced at different distances.

Figure 20:
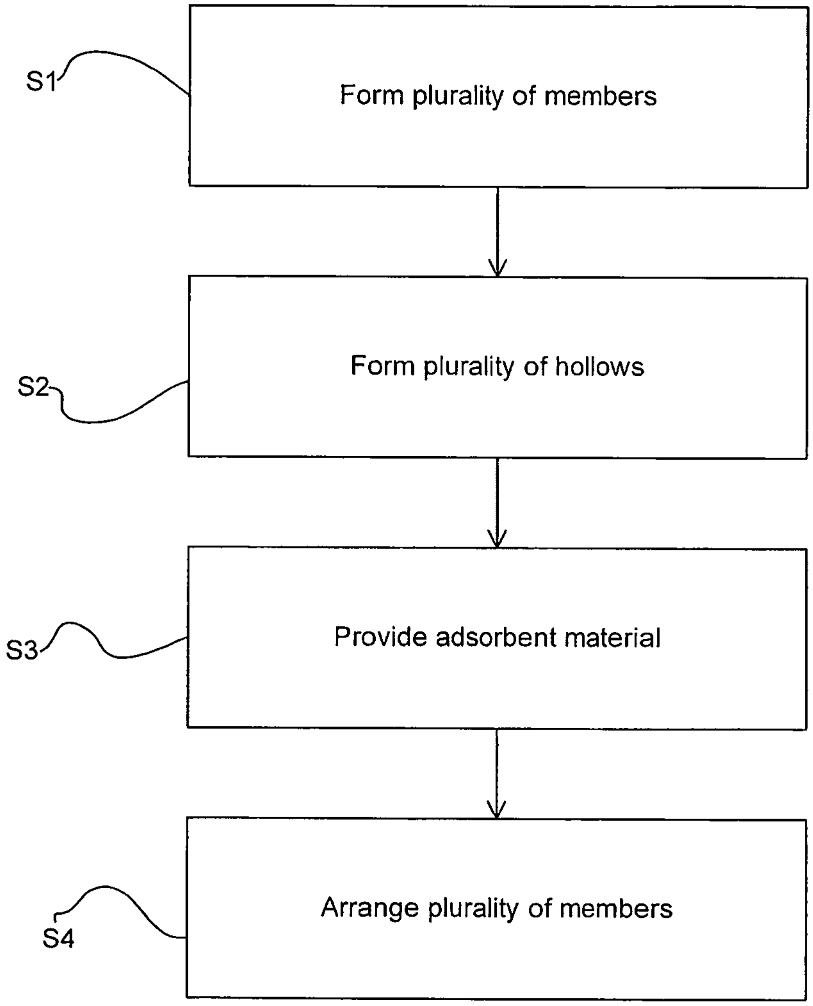
FIG. 20 is a flow chart depicting a method of manufacture of the apparatuses shown in FIGS. 3 to 11.

A method of manufacturing the pressure compensation apparatuses 12; 60; 70; 90 of FIGS. 3 to 15 will now be described with reference to FIG. 20.

In step S1, the plurality of members 42; 62; 72; 92 is formed. The members 42; 62; 72; 92 may be formed already including the plurality of hollows 50; 83; 96. The members 42; 62; 72; 92 may be formed thus by molding or pressing.

Alternatively, the members 42; 62; 72; 92 may be formed without the hollows. This may be performed in any suitable manner.

If the members 42; 62; 72; 92 are formed without already including the plurality of hollows 50; 83; 96, the next step S2 is to form a plurality of hollows 50; 83; 96 in the main surfaces 46, 48; 64, 66; 76; 78; 94 of the members 42; 62; 72; 92. The hollows 50; 83; 96 may be formed, for example, by drilling or laser boring. It should be understood that, if the plurality of members 42; 62; 72; 92 is formed already including the plurality of hollows 50; 83; 96, step S2 can be omitted.

In the next step S3, the adsorbent material having a regular structure is provided within the hollows. If the adsorbent material is a plurality of carbon nanotubes 54; 84, the nanotubes 54; 84 may either been grown in situ or may be grown elsewhere and affixed to the surface of the hollows 50; 83; 100. If the adsorbent material is graphite or metal-organic frameworks, a layer of the material may be deposited by, for example, CVD.

In step S4, the plurality of members 42; 62; 72; 92 is arranged. In the case of the first to third embodiments, this includes arranging the plurality of members 42; 62; 72 such that at least one main surface 46, 48; 64, 66; 76; 78 of each of the plurality of members 42; 62; 72 substantially faces and is spaced apart from one main surface 46, 48; 64, 66; 76; 78 of an adjacent one of the plurality of members 42; 62; 72. In the case of the fourth embodiment, this may include bundling the members 92 together in a suitable arrangement. For instance, the members 92 could be located within a container such as a porous bag or sack, analogous to a beanbag.

Figure 21:
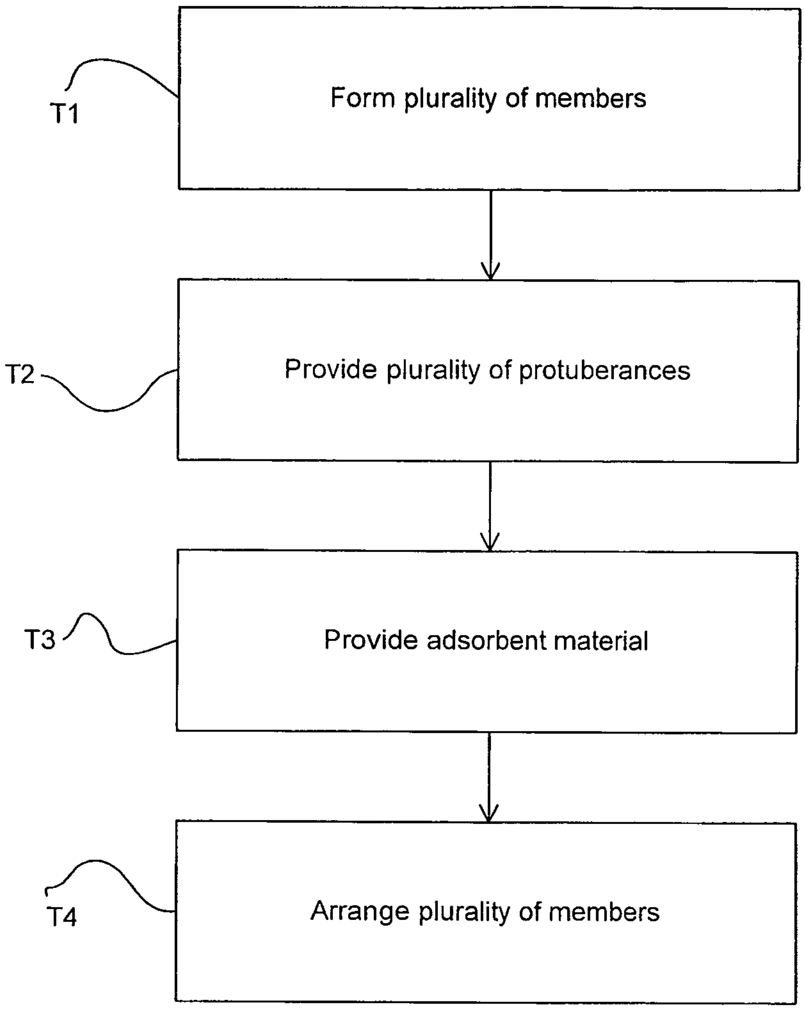
FIG. 21 is a flow chart depicting a method of manufacture of the apparatuses shown in FIGS. 18 and 19.

A method of manufacturing the pressure compensation apparatus 160 of FIGS. 18 and 19 will now be described with reference to FIG. 21.

In step T1, the plurality of members 162 is formed. The members 162 may be formed already including the plurality of protuberances 170. The members 162 may be formed thus by molding or pressing. Alternatively, the members 162 may be formed without the protuberances 170. This may be performed in any suitable manner.

If the members 162 are formed without already including the plurality of protuberances 170 the next step T2 is to provide a plurality of protuberances 170 in the main surfaces 166, 168 of the members 162. The protuberances 170 may be affixed to the members 162 in any suitable way, for example, by laser gluing. It should be understood that, if the plurality of members 162 is formed already including the plurality of protuberances 170, step T2 can be omitted.

In the next step T3, the adsorbent material having a regular structure is provided on the exterior surfaces 172 of the plurality of protuberances 170. If the adsorbent material is a plurality of carbon nanotubes 174, the nanotubes 174 may either been grown in situ or may be grown elsewhere and affixed to the surfaces 172 of the protuberances 170. If the adsorbent material is graphite or metal-organic frameworks, a layer of the material may be deposited by, for example, CVD.

In step T4, the plurality of members 162 is arranged. This includes arranging the plurality of members 162 such that at least one main surface 166, 168 of each of the plurality of members 162 substantially faces and is spaced apart from one main surface 166, 168 of an adjacent one of the plurality of members 162.

The above-described embodiments include loudspeaker units having integrated cavities. It will be appreciated, however, that other configurations may also be suitable. For example, instead of the loudspeaker unit itself being enclosed to form a cavity, an enclosed cavity may be formed by the combination of an unenclosed loudspeaker unit and a device into which the loudspeaker unit is incorporated.

Although the above pressure compensation apparatuses 12; 60; 70; 90; 99; 160 have been described with reference to loudspeakers, it should be understood that the apparatuses may also be suitable for use in other acoustic transducer devices, such as microphones.

A general description of features of the embodiments and advantages that may derive therefrom now follows.

Apparatus constructed with the features of a skeleton member having a predetermined configuration, and adsorbent material having a regular structure and being supported on the skeleton member, wherein the apparatus is arranged for compensating for pressure changes in an acoustic transducer system may have a predictable adsorbency. Having a predictable adsorbency may allow the performance of the apparatus to be simulated and optimized. Having a predictable adsorbency may also aid in the optimization of acoustic transducer systems through design. Such is not possible using prior art activated carbon material.

By providing hollows within the skeleton member, the surface area of the skeleton member may be greatly increased, thereby increasing greatly the adsorbency of the apparatus without simultaneously increasing the overall volume. Similarly, by providing protuberances on a skeleton member, the surface area of the skeleton member may be greatly increased, thereby increasing greatly the adsorbency of the apparatus without simultaneously substantially increasing the overall volume.

Spacing each sub-member of the plurality of sub-members is apart from adjacent ones of the plurality of sub-members can provide channels between the sub-members in which gas can easily flow, which may give rise to viscous losses within acceptable limits for a loudspeaker unit.

Making each sub-member of the plurality of sub-members substantially identical to the other sub-members of the plurality of sub-members may reduce the complexity of the manufacturing process of the apparatus in that it can require only the manufacture of multiple copies of a single sub-member.

By providing an acoustic transducer system comprising apparatus arranged for compensating for pressure changes in the acoustic transducer system, the apparatus comprising a skeleton member having a predetermined configuration, adsorbent material having a regular structure and being supported on the skeleton member, a diaphragm and a magnet, with a cavity formed between the diaphragm and the magnet and the apparatus is contained within the cavity, it may be possible to achieve satisfactory acoustic properties without requiring the presence of a rear cavity, or requiring a cavity that is smaller than would be required with the corresponding conventional arrangement. Consequently, the designs of devices, such as mobile phones, which incorporate the acoustic transducer systems, do not need to accommodate a loudspeaker having a rear cavity. Thus, one type of acoustic transducer system may be incorporated into many different types/models of device.

In an acoustic transducer system, comprising a diaphragm, wherein the skeleton member comprises a plurality of sub-members, arranging each of the plurality of sub-members is substantially perpendicularly to the diaphragm may give rise to viscous losses within acceptable limits for a loudspeaker unit.

It should be realized that the foregoing examples should not be construed as limiting. Other variations and modifications will be apparent to persons skilled in the art upon reading the present application. Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

What is claimed is:

1. An apparatus comprising:

an acoustic transducer system, said acoustic transducer system having a diaphragm;

a housing for said acoustic transducer system, said housing including a cavity having a substantially enclosed air volume;

a skeleton member having a predetermined configuration, said skeleton member being within said cavity; and adsorbent material supported on or in the skeleton member, said adsorbent material providing a regular surface based on said predetermined configuration of said skeleton member, so that air in said substantially enclosed air volume flows through said regular surface, wherein said adsorbent material compensates for pressure changes within said substantially enclosed air volume of said cavity by adsorbing gas molecules when the pressure increases and by releasing gas molecules when the pressure decreases within said substantially enclosed air volume in response to oscillation of said diaphragm.

2. The apparatus as in claim 1, wherein the skeleton member has a plurality of hollows formed therein, the adsorbent material being supported within each of the plurality of hollows.

3. The apparatus as in claim 2, wherein each of the plurality of hollows forms a duct through the skeleton member.

4. The apparatus as in claim 1, wherein the skeleton member comprises a plurality of protuberances formed thereon, the adsorbent material being supported on surfaces of the protuberances.

5. The apparatus as in claim 1, wherein the adsorbent material comprises a plurality of carbon nanotubes.

6. The apparatus as in claim 1, wherein the skeleton member has a plurality of hollows formed therein, the adsorbent material being a plurality of carbon nanotubes supported within each of the plurality of hollows, wherein each of the plurality of carbon nanotubes is arranged normal to a surface of one of the plurality of hollows.

7. The apparatus as in claim 1, wherein the skeleton member comprises a plurality of sub-members.

8. The apparatus as in claim 7, wherein each sub-member of the plurality of sub-members is spaced apart from adjacent ones of the plurality of sub-members.

9. The apparatus as in claim 8, wherein each of the plurality of sub-members has a plurality of hollows formed therein, the adsorbent material being supported within each of the plurality of hollows, wherein a maximum dimension through a centre point of an opening of each of the hollows is less than the distance between adjacent sub-members.

10. The apparatus as in claim 7, wherein each of the plurality of sub-members comprises a plate member.

11. The apparatus as in claim 7, wherein each sub-member of the plurality of sub-members is substantially identical to the other sub-members of the plurality of sub-members.

12. The apparatus as in claim 11, wherein the skeleton member has a predetermined regular configuration.

13. The apparatus as in claim 7, wherein an outermost boundary of the skeleton member is substantially cylindrical in form.

14. The apparatus as in claim 1, wherein the skeleton member is substantially spheroidal.

15. The apparatus as in claim 14, wherein the skeleton member has a plurality of hollows formed therein, the adsorbent material being supported within each of the hollows and wherein a maximum dimension through a centre point of an opening of each of the hollows is in the range of 0.5%-5% of a maximum diameter of the skeleton member.

16. The apparatus as in claim 14, comprising an agglomeration of skeleton members each having a predetermined configuration and supporting thereon adsorbent material having a regular structure.

17. The apparatus as in claim 14, comprising a plurality of spheroidal skeleton members each having a predetermined configuration and supporting thereon adsorbent material having a regular structure, wherein each skeleton member of the plurality of skeleton members is substantially identical to the other skeleton members of the plurality of skeleton members.

18. The apparatus as in claim 14, comprising a plurality of spheroidal skeleton members each having a predetermined configuration and supporting thereon adsorbent material having a regular structure, wherein different ones of the plurality of skeleton members are differently sized.

19. The apparatus as in claim 14, wherein the apparatus further comprises one or more blank members, the blank members not supporting adsorbent material thereon.

20. The apparatus as in claim 14, wherein the apparatus further comprises a porous receptacle enclosing the plurality of members.

21. A method comprising:

forming a skeleton member with a predetermined configuration;

supporting an adsorbent material on or in the skeleton member, said adsorbent material providing a regular surface based on said predetermined configuration of said skeleton member, so that air flows through said regular surface; and disposing said skeleton member within a cavity having a substantially enclosed air volume, said cavity being included in a housing for an acoustic transducer system, said method being a method of manufacturing an apparatus for compensating for pressure changes within said substantially enclosed air volume of said cavity, wherein said adsorbent material adsorbs gas molecules when the pressure increases and releases gas molecules when the pressure decreases within said substantially enclosed air volume in response to oscillation of said diaphragm.

22. An apparatus comprising:

an acoustic transducer system, said acoustic transducer system having a diaphragm;

a housing, said housing and said diaphragm defining a cavity having a substantially enclosed air volume;

a plurality of members, each of the plurality of members having a plurality of hollows formed therein, at least one main surface of each of the plurality of members substantially facing and spaced apart from a main surface of an adjacent one of the plurality of members, said plurality of members being within said cavity; and an adsorbent material provided within each of the plurality of hollows, wherein said adsorbent material compensates for pressure changes within said substantially enclosed air volume of said cavity by adsorbing gas molecules when the pressure increases and by releasing gas molecules when the pressure decreases within said substantially enclosed air volume in response to oscillation of said diaphragm.

23. The apparatus as in claim 22, wherein the each member of the plurality of members is substantially identical to the other members of the plurality of members.

24. The apparatus as in claim 22, wherein the adsorbent material comprises a plurality of carbon nanotubes.

25. The apparatus as in claim 24, wherein each of the plurality of nanotubes is arranged normal to a surface of one of the plurality of hollows.

26. The apparatus as in claim 22, wherein pluralities of hollows formed in each of the plurality of members are regularly arranged.

27. The apparatus as in claim 22, wherein a maximum dimension through a centre point of an opening of each of the hollows is less than the distance between adjacent members.

28. The apparatus as in claim 22, wherein each of the plurality of members comprises a plate member.

29. The apparatus as in claim 22, wherein each of the plurality of hollows comprises a duct through one of the plurality of members.

30. The apparatus as in claim 22, wherein the members are spaced apart at regular intervals.

31. A method comprising:

forming a plurality of members each with a plurality of hollows therein;

arranging the plurality of members such that at least one main surface of each of the plurality of members substantially faces and is spaced apart from one main surface of an adjacent one of the plurality of members;

providing an adsorbent material within each of the plurality of hollows; and disposing said plurality of members within a cavity having a substantially enclosed air volume, said cavity being defined by a diaphragm of an acoustic transducer system and a housing, said method being a method of manufacturing an apparatus for compensating for pressure changes within said substantially enclosed air volume of said cavity, wherein said adsorbent material adsorbs gas molecules when the pressure increases and releases gas molecules when the pressure decreases within said substantially enclosed air volume in response to oscillation of said diaphragm.

32. An apparatus comprising:

an acoustic transducer system, said acoustic transducer system having a diaphragm;

a housing, said housing and said diaphragm defining a cavity having a substantially enclosed air volume;

a plurality of substantially spheroidal members arranged in an agglomeration, each of the plurality of members having a plurality of hollows formed therein, said plurality of substantially spheroidal members being within said cavity; and an adsorbent material provided within each of the plurality of hollows, wherein said adsorbent material compensates for pressure changes within said substantially enclosed air volume of said cavity by adsorbing gas molecules when the pressure increases and by releasing gas molecules when the pressure decreases within said substantially enclosed air volume in response to oscillation of said diaphragm.

33. The apparatus as in claim 32, wherein the each member of the plurality of members is substantially identical to the other members of the plurality of members.

34. The apparatus as in claim 32, wherein a maximum dimension through a centre point of an opening of each of the hollows is in the range of 0.5%-5% of a maximum diameter of a one of the substantially spheroidal members.

35. An acoustic transducer system, said acoustic transducer system having a diaphragm and a housing, comprising apparatus arranged for compensating for pressure changes in the acoustic transducer system, the apparatus comprising:

a cavity having a substantially enclosed air volume, said cavity being included in said housing;

a skeleton member having a predetermined configuration, said skeleton member being within said cavity; and adsorbent material supported on or in the skeleton member, said adsorbent material providing a regular surface based on said predetermined configuration of said skeleton member, so that air in said substantially enclosed air volume flows through said regular surface, wherein said adsorbent material compensates for pressure changes within said substantially enclosed air volume of said cavity by adsorbing gas molecules when the pressure increases and by releasing gas molecules when the pressure decreases within said substantially enclosed air volume in response to oscillation of said diaphragm.

36. The acoustic transducer system as in claim 35, further comprising a magnet, wherein said cavity is formed between the diaphragm and the magnet.

37. The acoustic transducer system as in claim 35, further comprising a magnet, wherein said cavity is formed on the opposite side of the magnet from the diaphragm.

38. The acoustic transducer system as in claim 35, comprising an electrostatic speaker, wherein said cavity is formed adjacent the diaphragm.

39. The acoustic transducer system as in claim 35, wherein the skeleton member comprises a plurality of sub-members, wherein each of the plurality of sub-members is arranged substantially perpendicularly to the diaphragm.

40. The acoustic transducer system as in claim 35, wherein the skeleton member comprises a plurality of sub-members, wherein each of the plurality of sub-members is arranged substantially parallel to the diaphragm.

41. A mobile device comprising an acoustic transducer system, said acoustic transducer system having a diaphragm and a housing and comprising an apparatus arranged for compensating for pressure changes in said acoustic transducer system, said apparatus comprising:

a cavity having a substantially enclosed air volume, said cavity being included in said housing;

a skeleton member having a predetermined configuration, said skeleton member being within said cavity; and adsorbent material supported on or in the skeleton member, said adsorbent material providing a regular surface based on said predetermined configuration of said skeleton member, so that air in said substantially enclosed air volume flows through said regular surface, wherein said adsorbent material compensates for pressure changes within said substantially enclosed air volume of said cavity by adsorbing gas molecules when the pressure increases and by releasing gas molecules when the pressure decreases within said substantially enclosed air volume in response to oscillation of said diaphragm.

42. The acoustic transducer system as in claim 35, wherein said acoustic transducer system is a loudspeaker.

* * * * *